(12) United States Patent
So et al.

(10) Patent No.: US 10,673,013 B2
(45) Date of Patent: Jun. 2, 2020

(54) DISPLAY DEVICE AND METHOD FOR FABRICATING THE SAME

(71) Applicant: Samsung Display Co., Ltd., Yongin-si, Gyeonggi-do (KR)

(72) Inventors: Kyoungsub So, Cheonan-si (KR); Jongdae Park, Busan (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/522,587

(22) Filed: Jul. 25, 2019

(65) Prior Publication Data
US 2020/0052242 A1 Feb. 13, 2020

(30) Foreign Application Priority Data

Aug. 10, 2018 (KR) .................. 10-2018-0093665

(51) Int. Cl.
*H01L 51/52* (2006.01)
*B60K 35/00* (2006.01)
(Continued)

(52) U.S. Cl.
CPC .......... *H01L 51/5237* (2013.01); *B32B 7/12* (2013.01); *B32B 17/06* (2013.01); *B32B 37/12* (2013.01);
(Continued)

(58) Field of Classification Search
CPC combination set(s) only.
See application file for complete search history.

(56) References Cited

U.S. PATENT DOCUMENTS

| 7,589,883 B2* | 9/2009 | Varaprasad | B32B 17/06 359/267 |
| 7,830,602 B2* | 11/2010 | Hashimoto | G02B 3/0068 359/463 |

(Continued)

FOREIGN PATENT DOCUMENTS

| JP | 2005-326578 A | 11/2005 |
| KR | 10-2005-0094647 A | 9/2005 |

(Continued)

OTHER PUBLICATIONS

EPO Extended Search Report dated Nov. 27, 2019, for corresponding European Patent Application No. 19190850.8 (9 pages).

*Primary Examiner* — Lisa Lea-Edmonds
(74) *Attorney, Agent, or Firm* — Lewis Roca Rothgerber Christie LLP

(57) ABSTRACT

A display device includes a window and a display panel coupled to a bottom surface of the window. The display panel has a substantially regular tetragonal shape or a substantially rectangular shape in a plan view, and the window includes a base member and a bezel layer on a bottom surface of the base member. Between one and three light-transmissive main alignment marks and a transmission area having a different shape than that of the display panel are defined in the bezel layer, and each of the main alignment marks is arranged at a position corresponding to a vertex of the display panel or at a position corresponding to a vertex of an imaginary regular tetragon or of an imaginary rectangle that has the same center point as the display panel and that is larger than the display panel.

21 Claims, 18 Drawing Sheets

(51) Int. Cl.
*B32B 7/12* (2006.01)
*B32B 37/12* (2006.01)
*B32B 17/06* (2006.01)
*B32B 41/00* (2006.01)
*B60R 1/00* (2006.01)

(52) U.S. Cl.
CPC .............. *B32B 41/00* (2013.01); *B60K 35/00* (2013.01); *B32B 2605/00* (2013.01); *B60R 1/00* (2013.01); *B60R 2300/20* (2013.01); *B60R 2300/8046* (2013.01)

(56) References Cited

U.S. PATENT DOCUMENTS

| | | | |
|---|---|---|---|
| 9,521,224 B2* | 12/2016 | An | H04M 1/04 |
| 9,690,729 B2* | 6/2017 | Jolda | G06F 13/36 |
| 9,869,892 B2 | 1/2018 | Kim et al. | |
| 9,939,845 B2 | 4/2018 | Park et al. | |
| 10,059,265 B2* | 8/2018 | Schofield | B60R 21/01566 |
| 10,115,312 B2* | 10/2018 | Lee | G08G 1/164 |
| 10,207,585 B2* | 2/2019 | Oh | B60K 37/06 |
| 10,509,613 B2* | 12/2019 | Soh | B60R 11/0235 |
| 2010/0045790 A1* | 2/2010 | Lynam | B60K 35/00 348/140 |
| 2013/0174773 A1 | 7/2013 | Nagara et al. | |
| 2015/0002991 A1* | 1/2015 | Vander Sluis | B60R 7/04 361/679.01 |
| 2015/0097818 A1 | 4/2015 | Blackmer et al. | |
| 2015/0161836 A1* | 6/2015 | Park | G06K 9/00355 340/5.51 |
| 2017/0083275 A1* | 3/2017 | Shin | G06F 3/1454 |
| 2017/0237946 A1* | 8/2017 | Schofield | B60S 1/0822 348/148 |
| 2017/0297490 A1* | 10/2017 | Lynam | B60K 35/00 |
| 2017/0297498 A1* | 10/2017 | Larson | B60R 1/12 |
| 2017/0332494 A1 | 11/2017 | Park | |
| 2019/0135199 A1* | 5/2019 | Galan Garcia | G06F 3/044 |
| 2019/0181123 A1* | 6/2019 | Choi | H01L 25/0753 |
| 2019/0385334 A1* | 12/2019 | Hong | G06T 11/00 |
| 2020/0017026 A1* | 1/2020 | Kumar | G06T 7/70 |

FOREIGN PATENT DOCUMENTS

| | | |
|---|---|---|
| KR | 10-2015-0086140 A | 7/2015 |
| KR | 10-2016-0080491 A | 7/2016 |
| KR | 10-2016-0130925 A | 11/2016 |
| KR | 10-2017-0038428 A | 4/2017 |
| KR | 10-2017-0039024 A | 4/2017 |
| KR | 10-2017-0127110 A | 11/2017 |

* cited by examiner

DISPLAY DEVICE AND METHOD FOR FABRICATING THE SAME

CROSS-REFERENCE TO RELATED APPLICATION

This application claims priority to and the benefit of Korean Patent Application No. 10-2018-0093665, filed on Aug. 10, 2018 in the Korean Intellectual Property Office (KIPO), the entire content of which is hereby incorporated by reference.

BACKGROUND

Aspects of embodiments of the present disclosure relate to a display device and a method for fabricating the same.

Electronic devices, such as smart phones, tablets, notebook computers, navigation systems, and smart televisions, have been developed. These electronic devices generally include display devices to provide information and may further include various electronic modules in addition to the display devices.

The display devices are designed according to the use purpose of the electronic devices. To this end, the display devices may be designed to have various shapes.

SUMMARY

Embodiments of the present disclosure may provide a display device having a reduced failure rate.

Embodiments of the present disclosure may also provide a method for fabricating a display device that is capable of reducing a lamination process error.

According to an embodiment of the present disclosure, a display device includes a window and a display panel coupled to a bottom surface of the window. The display panel has a substantially regular tetragonal shape or a substantially rectangular shape in a plan view, and the window includes a base member and a bezel layer on a bottom surface of the base member. Between one and three light-transmissive main alignment marks and a transmission area having a different shape than that of the display panel are defined in the bezel layer, and each of the main alignment marks is arranged at a position corresponding to a vertex of the display panel or at a position corresponding to a vertex of an imaginary regular tetragon or of an imaginary rectangle that has the same center point as the display panel and that is larger than the display panel.

When two main alignment marks are defined in the bezel layer, the two main alignment marks may be arranged at positions corresponding to two vertices corresponding to one side edge of the display panel.

Each of the main alignment marks may overlap a vertex of the display panel.

The display panel may have a display area in which a pixel is arranged and a non-display area in which no pixel is arranged, and the non-display area may surround a periphery of the display area in a plan view.

The display device may further include a light-transmissive sub-alignment mark defined in the bezel layer, spaced from the main alignment marks, and having a different shape than that of the main alignment marks.

The sub-alignment mark may overlap an edge of the display panel.

The display device may further include a light-transmissive test mark defined in the bezel layer and arranged outside of the display panel.

A corner area of the display panel may have a curved line shape in a plan view.

The display device may be installed in a vehicle.

The transmission area may be exposed from an interior material of the vehicle, the interior material of the vehicle may cover a portion of the bezel layer, and the main alignment marks may overlap the interior material of the vehicle.

According to an embodiment of the present disclosure, a display device includes a window and a display panel coupled to a bottom surface of the window. The display panel has a display area having a substantially regular tetragonal shape or a substantially rectangular shape in a plan view and a non-display area outside of the display area. The window includes a base member and a bezel layer on a bottom surface of the base member. Between one and three light-transmissive main alignment marks and a transmission area having a different shape than that of the display area are defined in the bezel layer, and each of the main alignment marks is arranged at a position corresponding to a vertex of an imaginary regular tetragon or an imaginary rectangle that has the same center point as the display area and is larger than the display area.

The display panel may have a different shape than that of the display area in a plan view.

The display panel may have a substantially regular tetragonal shape or a substantially rectangular shape in a plan view.

Each of the main alignment marks may be arranged at a position corresponding to a vertex of the display panel.

According to an embodiment of the present disclosure, a display device includes a window and a display panel coupled to a bottom surface of the window. The display panel has a regular tetragonal shape with a curved corner area in a plan view or a rectangular shape with a curved corner area in a plan view, the window includes a base member and a bezel layer on a bottom surface of the base member. Between one and three light-transmissive main alignment marks and a transmission area having a different shape than that of the display panel are defined in the bezel layer, and each of the main alignment marks is arranged at a position corresponding to a vertex of the display panel or at a position corresponding to a vertex of an imaginary regular tetragon or an imaginary rectangle that has the same center point as the display panel and that is larger than the display panel.

According to an embodiment of the present disclosure, a display device includes a window and a display panel coupled to a bottom surface of the window. The display panel has a substantially regular polygonal shape having n edges in a plan view, and the window includes a base member and a bezel layer on a bottom surface of the base member. A number of light-transmissive alignment marks and a transmission area having a different shape than that of the display panel are defined in the bezel layer. The number of the alignment marks is n-i, where "i" is a natural number equal to or greater than one and less than "n", and each of the alignment marks is arranged at a position corresponding to a vertex of the display panel or at a position corresponding to a vertex of an imaginary polygon that has the same center point as the display panel and that is larger than the display panel.

According to an embodiment of the present disclosure, a method for fabricating a display device includes: preliminarily aligning a display panel with a window, the display panel having a substantially regular tetragonal shape or a substantially rectangular shape, the window having a transmission area having a different shape than that of the display panel, a non-transmission area adjacent to the transmission area, and a number of main alignment marks in the non-transmission area; calculating positions of vertices of the display panel and a position of a center point of the display panel; calculating positions of imaginary points on the window corresponding to at least some of the vertexes of the display panel and a position of an alignment center point of the window corresponding to the center point of the display panel by using numerical information of the display panel and the main alignment marks; aligning the center point of the display panel with the alignment center point of the window such that the center point coincides with the alignment center point; and coupling the window and the display panel to each other. The number of the main alignment marks is less than the number of the vertices of the display panel.

The window may further include a sub-alignment mark spaced from the main alignment mark and arranged at a position corresponding to a vertex of an imaginary regular tetragon or an imaginary rectangle that has the same center point as the display panel and that is larger than the display panel. The method may further include re-calculating the imaginary points and the alignment center point by using the sub-alignment mark when an error occurs between the center point and the alignment center point during the aligning of the center point with the alignment center point.

The window may further include a test mark spaced from the main alignment mark, and the method may further include calculating a distance between the test mark and an edge of the display panel after the coupling of the window and the display panel.

The method may further include placing an adhesive member between the display panel and the window.

The main alignment mark may include two main alignment marks, and the two main alignment marks may be arranged at positions corresponding to two vertices corresponding to one side edge of the display panel.

BRIEF DESCRIPTION OF THE DRAWINGS

The accompanying drawings are included to provide a further understanding of the inventive concepts by illustrating exemplary embodiments of the present disclosure, and these drawings are incorporated in and constitute a part of this specification. The drawings, together with the description, serve to further explain aspects and features of the inventive concepts. In the drawings.

DETAILED DESCRIPTION

Figure 1:
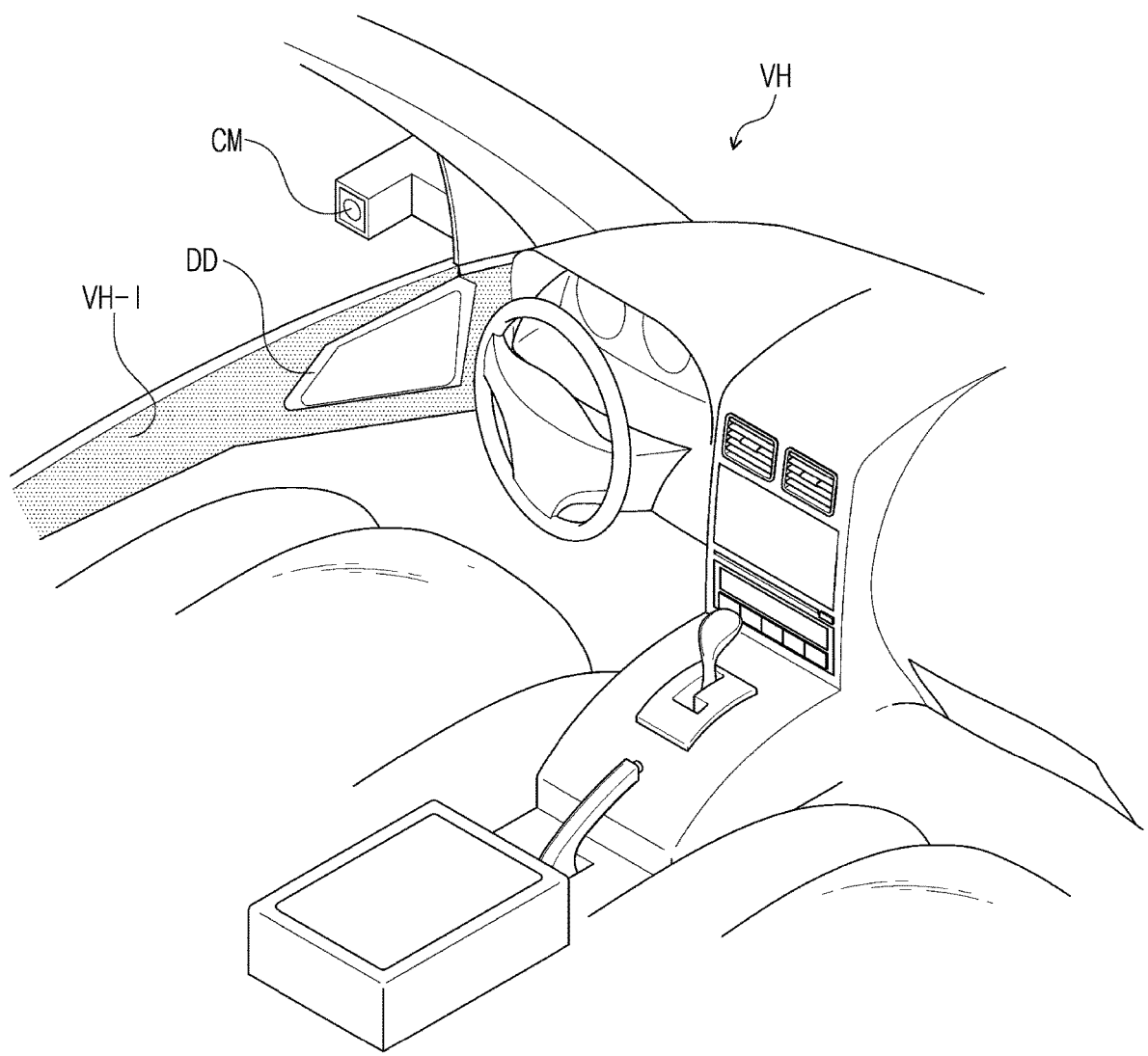
FIG. 1 is a perspective view of the inside of a vehicle in which a display device according to an embodiment of the present disclosure is installed.

The inventive concepts now will be described more fully hereinafter with reference to the accompanying drawings, in which various example embodiments are shown. The inventive concepts may, however, be embodied in many different forms and should not be construed as limited to the example embodiments set forth herein. Rather, these embodiments are provided so that this disclosure will be thorough and complete, and will fully convey the scope of the inventive concepts to those skilled in the art. Like reference numerals refer to like elements throughout. And it will be understood that when an element, such as a layer, region, or substrate, is referred to as being "on" another element, it may be directly on the other element or intervening elements may be present. The term "directly" indicates that there are no intervening elements. As used herein, the term "or" means "and/or," and the term "and/or" includes any and all combinations of one or more of the associated listed items. The term "exemplary" is intended to refer to an example or illustration. Further, the use of "may" when describing embodiments of the present invention relates to "one or more embodiments of the present invention." As used herein, the terms "use," "using," and "used" may be considered synonymous with the terms "utilize," "utilizing," and "utilized," respectively.

The terminology used herein is for the purpose of describing particular example embodiments only and is not intended to be limiting. As used herein, the singular forms "a" and "an" are intended to include the plural forms, including "at least one," unless the content clearly indicates otherwise. It will be further understood that the terms "comprises," "comprising," "includes," and/or "including," when used in this specification, specify the presence of the stated features, regions, integers, steps, operations, elements, and/or components but do not preclude the presence or addition of one or more other features, regions, integers, steps, operations, elements, components, and/or groups thereof.

Spatially relative terms, such as "beneath", "below", "lower", "above", "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees or at other orientations), and the spatially relative descriptors used herein should be interpreted accordingly.

It will be understood that, although the terms first, second, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings herein.

Exemplary embodiments are described herein with reference to cross-sectional illustrations and/or plane (or plan) illustrations that are idealized exemplary illustrations. Thus, in the drawings, thicknesses of layers and regions may be exaggerated for clarity, and variations in the shapes of the illustrations as a result, for example, of manufacturing techniques and/or tolerances, are to be expected. Thus, the exemplary embodiments described herein should not be construed as being limited to the shapes of regions illustrated herein but are to include deviations in shapes that result, for example, from manufacturing. For example, an etching region illustrated as a rectangle may have rounded or curved features. Thus, the regions illustrated in the figures are schematic in nature and their shapes are may not illustrate the actual shape of a region of a device and are not intended to limit the scope of exemplary embodiments.

Figure 2:
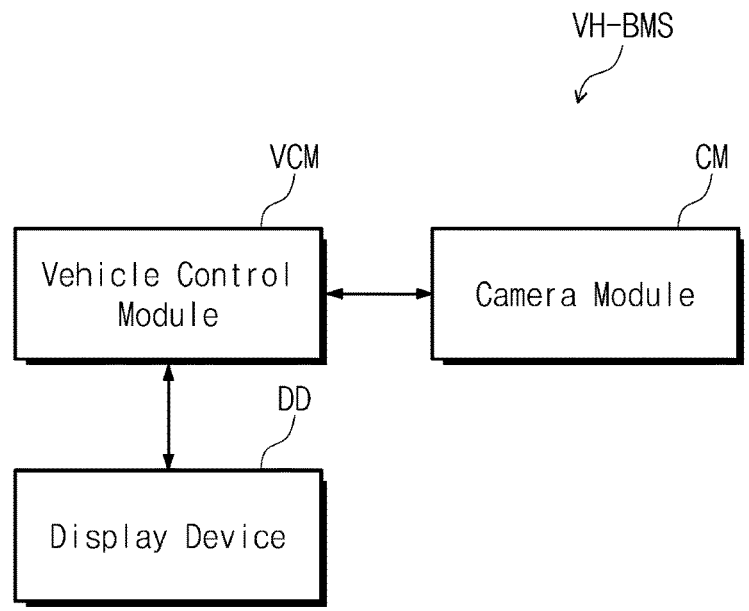
FIG. 2 is a block diagram illustrating a rear monitoring system of a vehicle in which a display device according to an embodiment of the present disclosure is installed.
Figure 3:
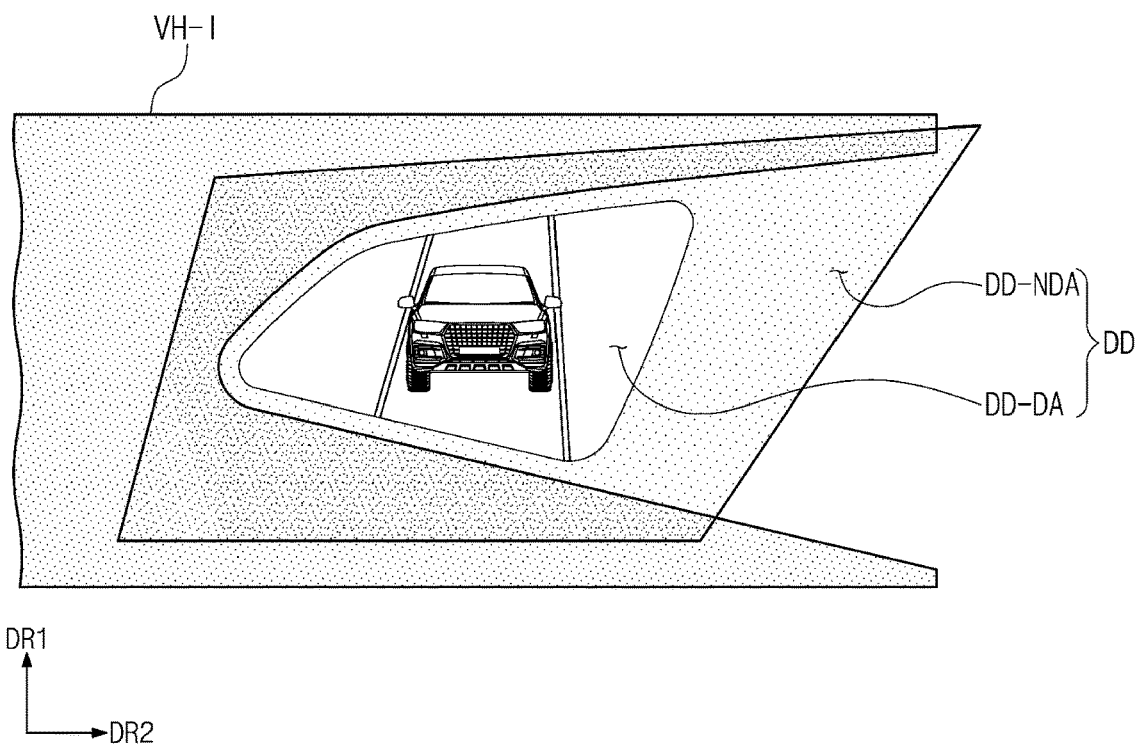
FIG. 3 is a schematic view of arrangement of an interior material of the vehicle and a display device according to an embodiment of the present disclosure.

FIG. 1 is a perspective view of the inside of a vehicle VH in which a display device DD according to an embodiment of the present disclosure is installed. FIG. 2 is a block diagram illustrating a rear monitoring system VH-BMS of the vehicle VH in which the display device DD according to an embodiment of the present disclosure is installed. FIG. 3 is a schematic view of arrangement of an interior material VH-I of the vehicle VH and the display device DD according to an embodiment of the present disclosure.

As illustrated in FIG. 1, a display device DD according to an embodiment of the present disclosure may be disposed on (or in) a door of a vehicle VH. The display device DD may be disposed between an interior material VH-I and a door frame of the vehicle VH.

The display device DD may be included in (e.g., may be a part of) a rear monitoring system (e.g., a rear-side monitoring system) VH-BMS of the vehicle VH, which is schematically illustrated in FIG. 2. In the present embodiment, the rear monitoring system VH-BMS of the vehicle VH is illustrated as an example, and embodiments of the present disclosure are not limited thereto. In another embodiment, the display device DD according to the present disclosure may be used as a component of (e.g., may be a part of) another functional system interlocked (or interconnected) with a vehicle control module VCM to provide information. For example, the display device DD may be used as a component of a navigation system or a multimedia system.

As illustrated in FIG. 2, the rear monitoring system VH-BMS of the vehicle VH may include the vehicle control module VCM, a camera module CM, and the display device DD. The vehicle control module VCM may be an electronic module including a microprocessor and/or an image processor and may receive image data outputted from the camera module CM. The image data may have information on an image of the rear of the vehicle VH (e.g., the camera may be oriented and positioned to face a rear of the vehicle VH). The vehicle control module VCM may convert the image data received from the camera module CM into data suitable for (e.g., suitable to be displayed on) the display device DD and may transmit the converted image data to the display device DD. A user may obtain (e.g., may view) the rear image of the vehicle VH in real time through the display device DD.

As illustrated in FIG. 3, a portion of the display device DD may be exposed to (e.g., visible to) a user, and another portion of the display device DD may be covered by (e.g., may not be visible to the user due to) the interior material VH-I. The display device DD may include a display area DD-DA and a bezel area DD-NDA. The display area DD-DA and a portion of the bezel area DD-NDA may be exposed from the interior material VH-I to a user.

Figure 4A:
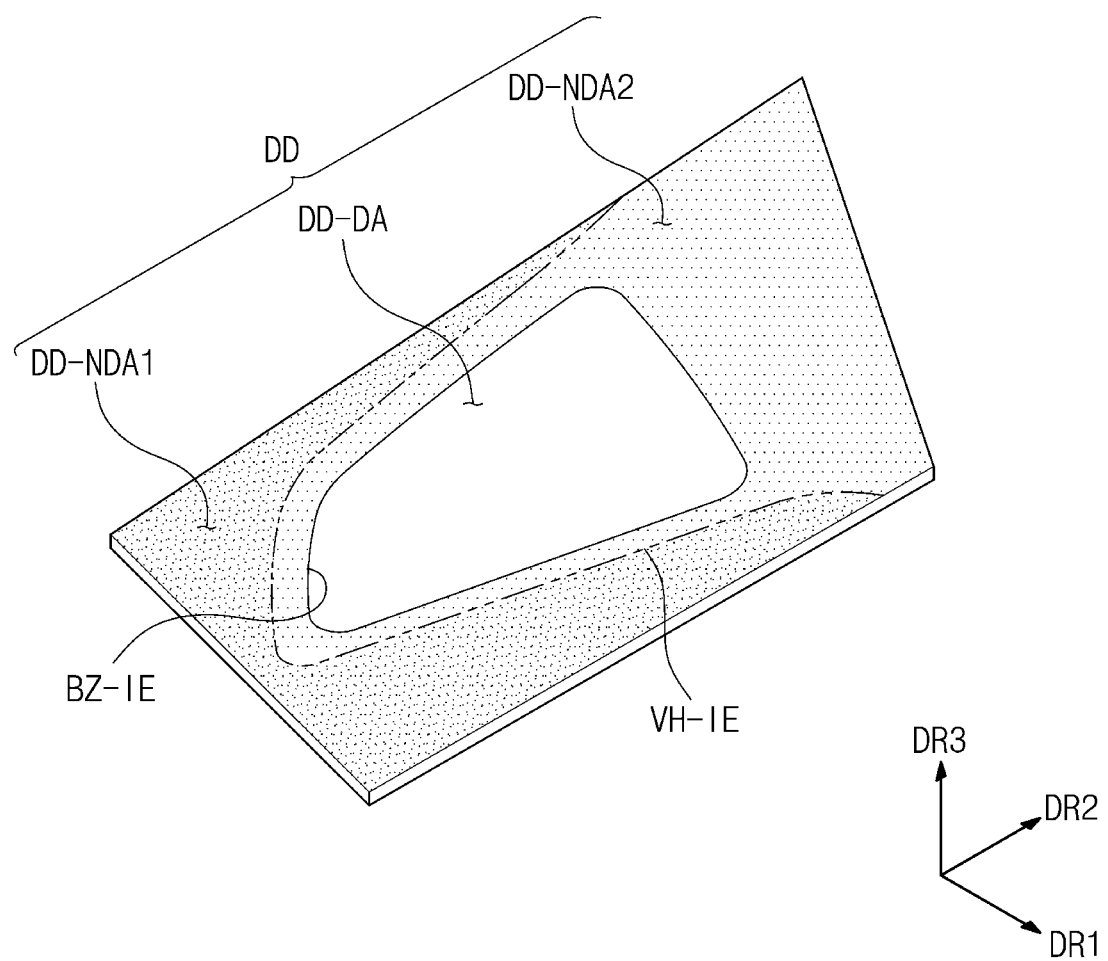
FIG. 4A is a perspective view of a display device according to an embodiment of the present disclosure.
Figure 4B:
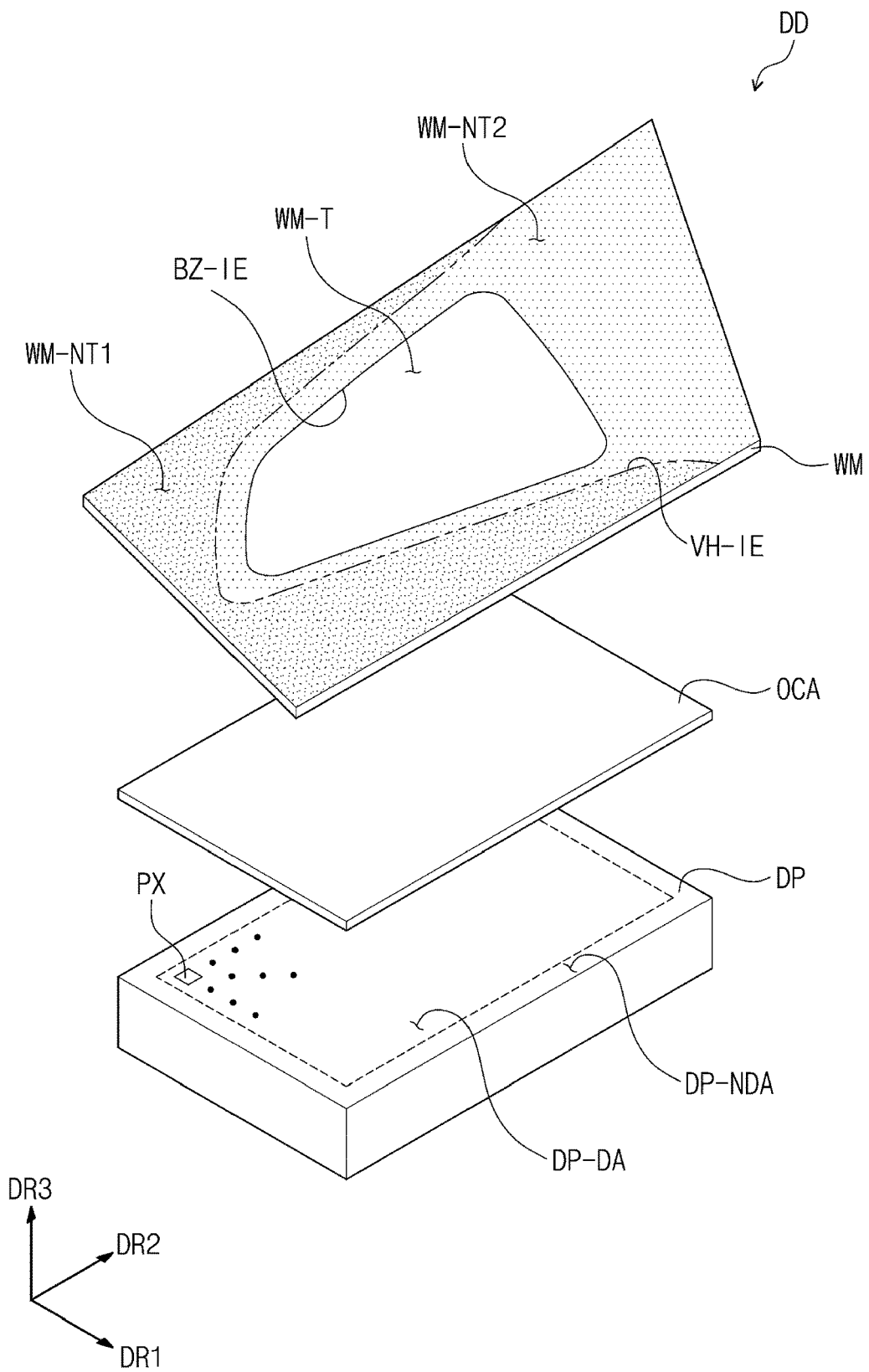
FIG. 4B is an exploded perspective view of a display device according to an embodiment of the present disclosure.
Figure 4C:
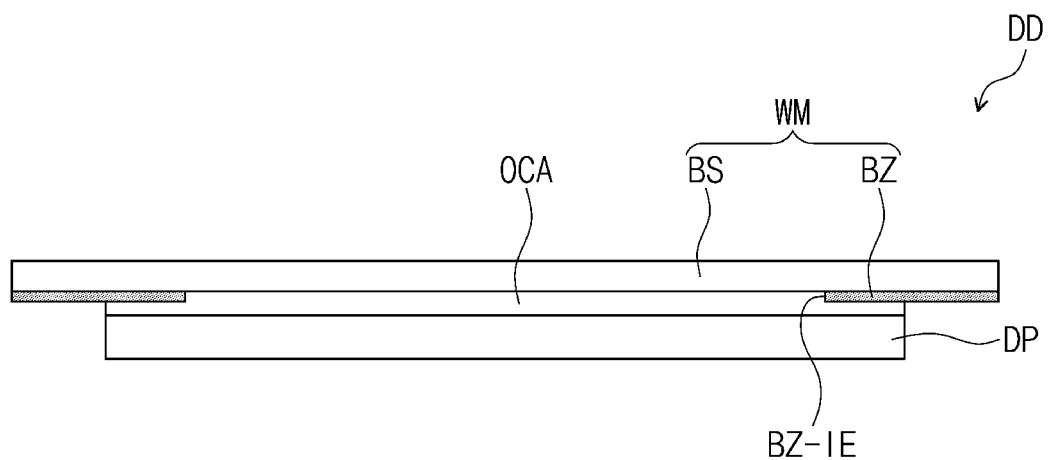
FIG. 4C is a cross-sectional view of a display device according to an embodiment of the present disclosure.
Figure 5A:
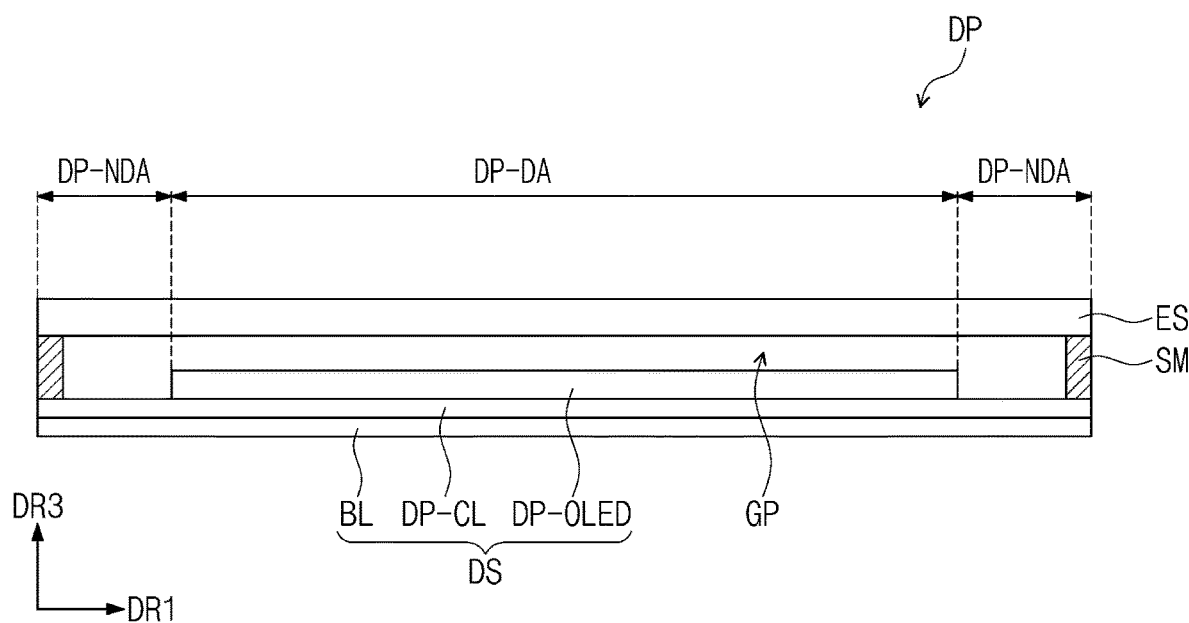
FIG. 5A is a cross-sectional view of a display panel according to an embodiment of the present disclosure.
Figure 5B:
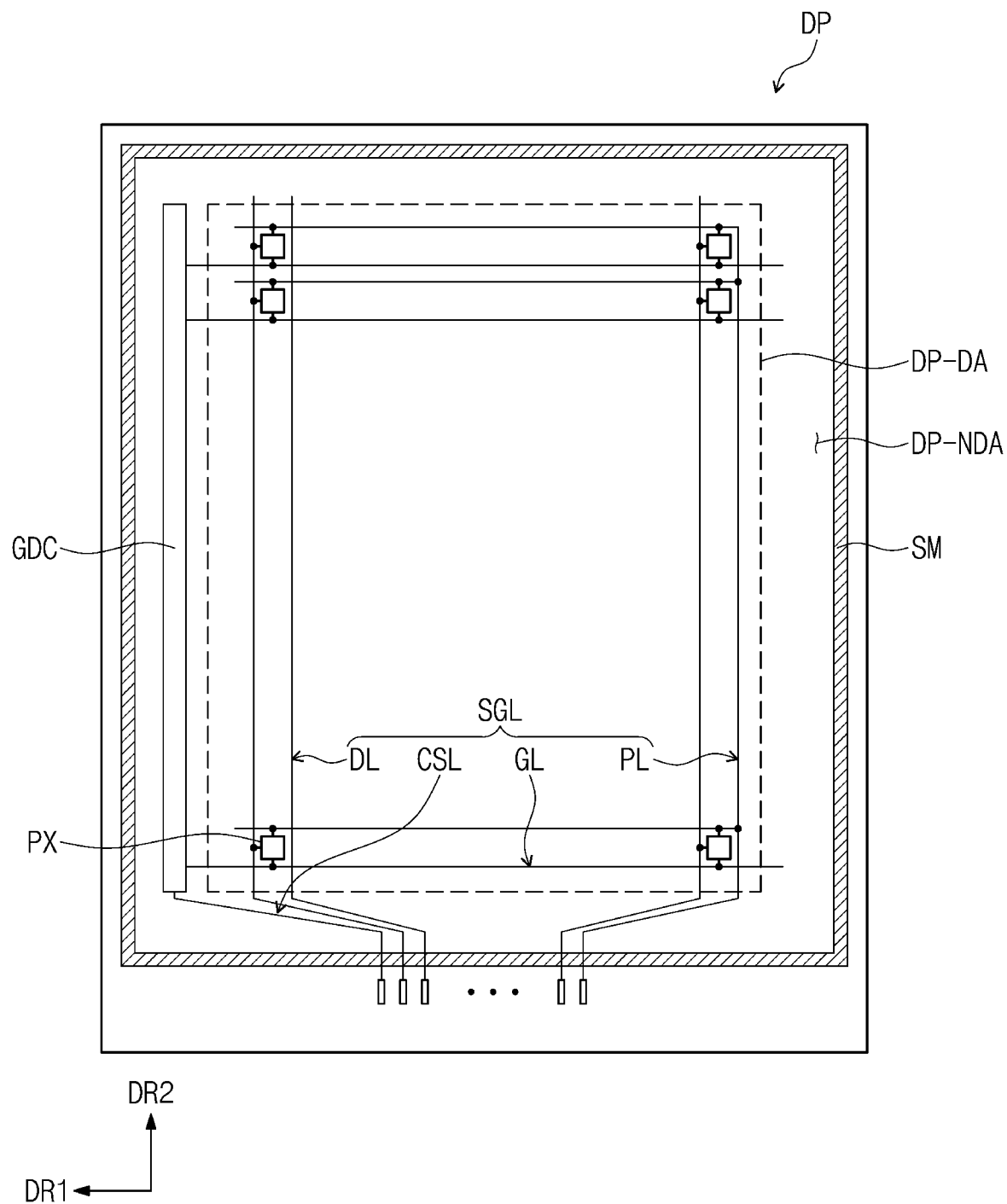
FIG. 5B is a plan view of a display panel according to an embodiment of the present disclosure.
Figure 5C:
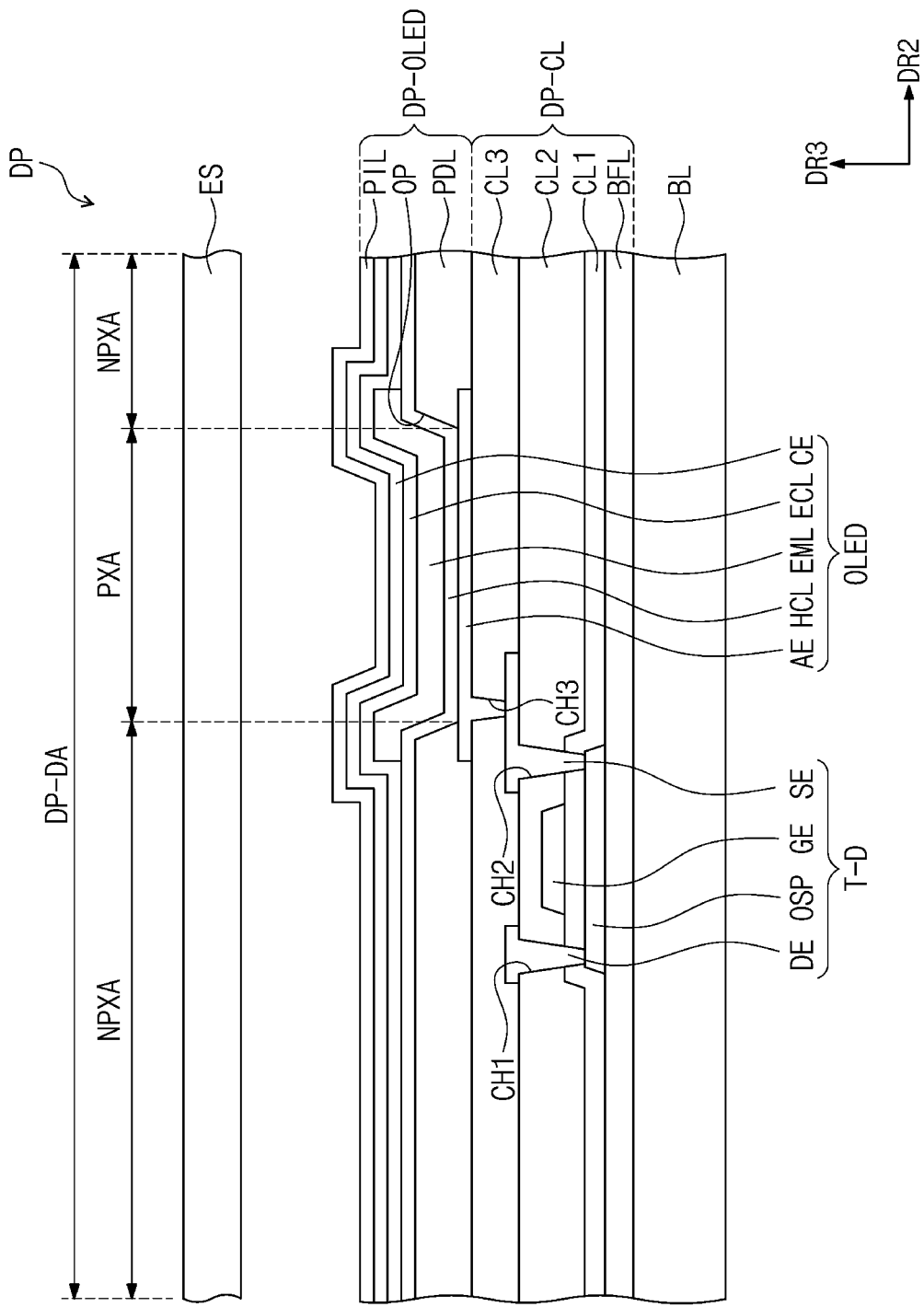
FIG. 5C is an enlarged cross-sectional view of a display panel according to an embodiment of the present disclosure.

FIG. 4A is a perspective view of the display device DD according to an embodiment of the present disclosure. FIG. 4B is an exploded perspective view of the display device DD according to an embodiment of the present disclosure. FIG. 4C is a cross-sectional view of the display device DD according to an embodiment of the present disclosure. FIG. 5A is a cross-sectional view of a display panel DP according to an embodiment of the present disclosure. FIG. 5B is a plan view of the display panel DP according to an embodiment of the present disclosure. FIG. 5C is an enlarged cross-sectional view of the display panel DP according to an embodiment of the present disclosure.

The display device DD illustrated in FIG. 4A may display an image through a front surface (or a display surface) of the display area DD-DA. The front surface may be parallel to a plane defined by a first directional axis DR1 and a second directional axis DR2. A normal direction of the front surface (e.g., a thickness direction of the display device DD) may be parallel to a third directional axis DR3.

When a direction in which an image is displayed is the same as a direction indicated by the third directional axis DR3, a top surface (or a front surface) and a bottom surface (or a rear surface) of members, units, or components of the display device DD may be defined by the third directional axis DR3. Hereinafter, first, second, and third directions are directions indicated by the first, second, and third directional axes DR1, DR2, and DR3, respectively, and are indicated by the same reference designators as the first, second, and third directional axes DR1, DR2, and DR3.

As illustrated in FIG. 4A, the display area DD-DA may have an atypical polygonal shape when viewed in a plan view. The planar shape of the display area DD-DA may be defined by an inner edge BZ-IE of a bezel layer BZ (see, e.g., FIG. 4C).

The atypical polygonal shape refer to a shape that is not a substantially rectangular shape and/or a substantially regular polygonal shape having n edges. Here, a "substantially rectangular shape" refers to not only a mathematical rectangular shape but also a roughly (e.g., a substantially or generally) rectangular shape in which a vertex angle is not formed at a vertex, unlike the mathematical rectangular shape. A "substantially regular polygonal shape having the n edges" refers to not only a mathematical regular polygonal shape but also a roughly (e.g., a substantially or generally) regular polygonal shape having n edges in which a vertex angle is not formed at a vertex, unlike the mathematical regular polygonal shape. Here, "n" is a natural number of three or more. When n is 4, the substantially regular polygonal shape is a substantially regular tetragon shape.

In FIG. 4A, the bezel area DD-NDA shown in FIG. 3 may be divided into two bezel areas DD-NDA1 and DD-NDA2. Hereinafter, a first bezel area DD-NDA1 may be defined as a portion of the bezel area DD-NDA which is covered by the interior material VH-I (see, e.g., FIG. 3), and a second bezel area DD-NDA2 may be defined as another portion of the bezel area DD-NDA which is exposed from (e.g., is not covered by) the interior material VH-I. An imaginary edge VH-IE of the interior material VH-I which may overlap with the display device DD is illustrated in FIG. 4A. The first bezel area DD-NDA1 and the second bezel area DD-NDA2 are illustrated by different hatchings for ease and convenience in description and illustration.

The display device DD having a flat display surface is illustrated in the present embodiment. However, embodiments of the present disclosure are not limited thereto. In other embodiments, the display device DD may include a curved display surface or a three-dimensional (3D) display surface. The 3D display surface may include a plurality of display areas indicated by (e.g., normal to or facing) different directions. For example, the 3D display surface may have a substantially regular tetragonal shape.

The display device DD according to the present embodiment may be a rigid display device. However, embodiments of the present disclosure are not limited thereto. In another embodiment, the display device DD may be a flexible display device.

As illustrated in FIGS. 4B and 4C, the display device DD may include a window WM, a display panel DP, and an adhesive member (e.g., an optically-clear adhesive) OCA coupling the window WM and the display panel DP to each other.

As illustrated in FIGS. 4A-4C, the window WM may include a base layer BS and a bezel layer BZ. A transmission area WM-T, a first light blocking area WM-NT1, and a second light blocking area WM-NT2, which correspond to the display area DD-DA, the first bezel area DD-NDA1, and the second bezel area DD-NDA2 of the display device DD, respectively, may be defined in the window WM. The first and second light blocking areas WM-NT1 and WM-NT2 may be substantially an area in which the bezel layer BZ is disposed, and the transmission area WM-T may be substantially an area in which the bezel layer BZ is not disposed.

The base layer BS may include a glass substrate and/or a synthetic resin film. The base layer BS is not limited to a single layer. For example, the base layer BS may include a plurality of films coupled to each other by one or more adhesive members.

The bezel layer BZ may be a colored organic layer and may be formed by, for example, a coating method. The bezel layer BZ may have a multi-layered structure. The bezel layer BZ may include a color layer including a dye and/or a pigment.

The window WM may further include a functional layer (e.g., a functional coating layer) disposed on a front surface of the base layer BS. The functional layer may include an anti-fingerprint layer, an anti-reflection layer, and/or a hard coating layer.

The adhesive member OCA may be a transparent adhesive member. For example, the adhesive member OCA may be a pressure-sensitive adhesive film. However, embodiments of the present disclosure are not limited thereto. In other embodiments, the adhesive member OCA may include a general adhesive or glue.

The display panel DP according to an embodiment of the present disclosure may be, but is not limited to, a light emitting display panel. For example, the display panel DP may be an organic light emitting display panel or a quantum dot light emitting display panel. A light emitting layer of the organic light emitting display panel may include an organic light emitting material, and a light emitting layer of the quantum dot light emitting display panel may include a quantum dot and/or a quantum rod. Hereinafter, the organic light emitting display panel DP will be described as an example.

The display panel DP may have a different shape than that of the display area DD-DA of the display device DD and that of the transmission area WM-T of the window WM. The display panel DP may have a substantially typical polygonal shape when viewed in a plan view. The typical polygonal shape may refer to a rectangular shape or a regular polygonal shape having n edges. A "substantially typical polygonal shape" may refer to a mathematical rectangular shape or mathematical regular polygonal shape in which a vertex angle is formed at a vertex, or may refer to a roughly (e.g., substantially or generally) rectangular shape or a roughly (e.g., substantially or generally) regular polygonal shape in which a vertex angle is not formed at a vertex but which has a curved corner area. The regular polygonal shape may be a regular tetragonal shape.

In addition, the typical polygonal shape may include a polygonal shape in which diagonal lines, each of which links (or extends between) adjacent vertices, meet (or intersect) each other at one point. For example, the typical polygonal shape may include a lozenge shape, a rectangular shape, or a regular polygonal shape having an even number of edges, such as four or more edges.

The shape of the display panel DP in a plan view may be defined by an edge of a display substrate DS or an encapsulation substrate ES described later with reference to FIGS. 5A-5C.

The display panel DP may include a display area DP-DA and a non-display area DP-NDA. The display area DP-DA may be an area in which pixels PX are disposed, and the non-display area DP-NDA may be an area in which the pixels PX are not disposed. The display area DP-DA may also have a substantially typical polygonal shape. Even though the display area DP-DA of the display panel DP and the transmission area WM-T of the window WM have different shapes, the transmission area WM-T may be disposed inside the display area DP-DA (e.g., the transmission area WM-T may extend around a periphery of the display area DP-DA) when viewed in a plan view.

The display device DD may further include an optical film for reducing reflectance of natural light (e.g., sunlight)

incident from the outside. The optical film may be disposed between the window WM and the display panel DP. The optical film may include a phase retarder and a polarizer. The display device DD may further include a touch screen, which may be integrally formed with the display panel DP or may be adhered to the display panel DP.

As illustrated in FIG. 5A, the display panel DP may include a display substrate DS, an encapsulation substrate ES, and a sealing member SM. In the present embodiment, a rigid display panel DP is illustrated as an example. In other embodiments, a flexible display panel may be applied to the display device DD. The flexible display panel may not include the encapsulation substrate ES and the sealing member SM but may include encapsulation thin films, which encapsulate or seal the display substrate DS.

The display substrate DS may include a base layer BL, a circuit element layer DP-CL disposed on the base layer BL, and a display element layer DP-OLED disposed on the circuit element layer DP-CL. The base layer BL may include a glass substrate. In some embodiments, the base layer BL may include a substrate having a substantially constant refractive index in a wavelength range of visible light.

The circuit element layer DP-CL may include an insulating layer and a circuit element. Hereinafter, the insulating layer included in the circuit element layer DP-CL is referred to as an intermediate insulating layer. The intermediate insulating layer may include one or more intermediate inorganic layers and/or one or more intermediate organic layers. The circuit element may include a signal line and a driving circuit of a pixel.

The display element layer DP-OLED may include a light emitting element. The display element layer DP-OLED may include organic light emitting diodes as the light emitting elements. The display element layer DP-OLED may include a pixel defining layer including, for example, an organic material.

The encapsulation substrate ES may be a transparent substrate, such as a glass substrate. In some embodiments, the encapsulation substrate ES may include a substrate having a substantially constant refractive index in a wavelength range of visible light.

The sealing member SM may include an inorganic adhesive member, such as frit. In some embodiments, the sealing member SM may include an organic adhesive member. The sealing member SM may overlap with the non-display area DP-NDA of the display panel DP. The sealing member SM may form a gap GP between the display substrate DS and the encapsulation substrate ES. The gap GP may be filled with air or an inert gas. Hereinafter, the air or inert gas is referred to as an external gas. The encapsulation substrate ES and the sealing member SM may prevent moisture from permeating to the display substrate DS.

As illustrated in FIG. 5B, the display panel DP may include a driving circuit GDC, a plurality of signal lines SGL, and a plurality of pixels PX. Each of the pixels PX may include the light emitting element and a pixel driving circuit connected to the light emitting element. The driving circuit GDC, the signal lines SGL, and the pixel driving circuits may be included in the circuit element layer DP-CL illustrated in FIG. 5A.

The driving circuit GDC may include a scan driving circuit. The scan driving circuit may generate a plurality of scan signals and may sequentially output the scan signals to a plurality of scan lines GL to be further described below. The scan driving circuit may further output other control signals to the pixel driving circuits.

The scan driving circuit may include a plurality of thin film transistors formed by the same process (e.g., a low-temperature polycrystalline silicon (LTPS) process or a low-temperature polycrystalline oxide (LTPO) process) as the pixel driving circuits.

The signal lines SGL may include scan lines GL, data lines DL, a power line PL, and a control signal line CSL. Each of the scan lines GL may be connected to corresponding ones of the pixels PX, and each of the data lines DL may be connected to corresponding ones of the pixels PX. The power line PL may be connected to the pixels PX. The control signal line CSL may provide control signals to the scan driving circuit.

The signal lines SGL may be connected to a circuit board. The signal lines SGL may be connected to a timing control circuit mounted on the circuit board in the form of an integrated chip. In an embodiment of the present disclosure, the integrated chip may be connected to the signal lines SGL disposed in the non-display area DP-NDA.

As illustrated in FIG. 5C, the circuit element layer DP-CL may include a buffer layer BFL including an inorganic layer, a first intermediate inorganic layer CL1, a second intermediate inorganic layer CL2, and an intermediate organic layer CL3. In FIG. 5C, arrangement relationship of a semiconductor pattern OSP, a control electrode GE, an input electrode DE, and an output electrode SE of a driving transistor T-D is illustrated as an example. First and second openings (e.g., first and second through-holes) CH1 and CH2 are also illustrated as an example.

The display element layer DP-OLED may include the light emitting element. The display element layer DP-OLED may include an organic light emitting diode OLED as the light emitting element. The display element layer DP-OLED may include a pixel defining layer PDL. For example, the pixel defining layer PDL may be an organic layer.

A first electrode AE may be disposed on the intermediate organic layer CL3. The first electrode AE may be connected to the output electrode SE through a third opening (e.g., a third through-hole) CH3 penetrating the intermediate organic layer CL3. An opening OP may be defined in the pixel defining layer PDL. The opening OP in the pixel defining layer PDL may expose at least a portion of the first electrode AE. The opening OP in the pixel defining layer PDL is referred to as an emission opening to distinguish it from other openings.

The display area DP-DA of the display panel DP may include a light emitting area PXA and a non-light emitting area NPXA adjacent to the light emitting area PXA. The non-light emitting area NPXA may surround (e.g., may surround or extend around a periphery of) the light emitting area PXA. In the present embodiment, the light emitting area PXA is defined to correspond to a portion of the first electrode AE that is exposed through the emission opening OP.

A hole control layer HCL may be disposed in common in the light emitting area PXA and the non-light emitting area NPXA (e.g., the hole control layer HCL may be disposed in both the light emitting area PXA and the non-light emitting area NPXA). The hole control layer HCL may include a hole transfer layer and may further include a hole injection layer. An emission layer EML may be disposed on the hole control layer HCL. The emission layer EML may be disposed in an area corresponding to the emission opening OP. For example, the emission layers EML of the pixels PX may be separated from each other. The emission layer EML may include an organic material and/or an inorganic material.

The emission layer EML may generate color light (e.g., the emission layer EML may generate light having a predetermined color).

An electron control layer ECL may be disposed on the emission layer EML. The electron control layer ECL may include an electron transfer layer and may further include an electron injection layer. The hole control layer HCL and the electron control layer ECL may be formed in common in the plurality of pixels PX by using an open mask (e.g., a single hole control layer HCL and a single electron control layer ECL may be formed over all of the pixels PX). A second electrode CE may be disposed on the electron control layer ECL. The second electrode CE may be disposed in common in the plurality of pixels PX.

A protective layer PIL may be disposed on the display element layer DP-OLED. The protective layer PIL may protect the second electrode CE of the organic light emitting diode OLED. The protective layer PIL may include an inorganic material, such as silicon oxide, silicon nitride, and/or silicon oxynitride.

Figure 6A:
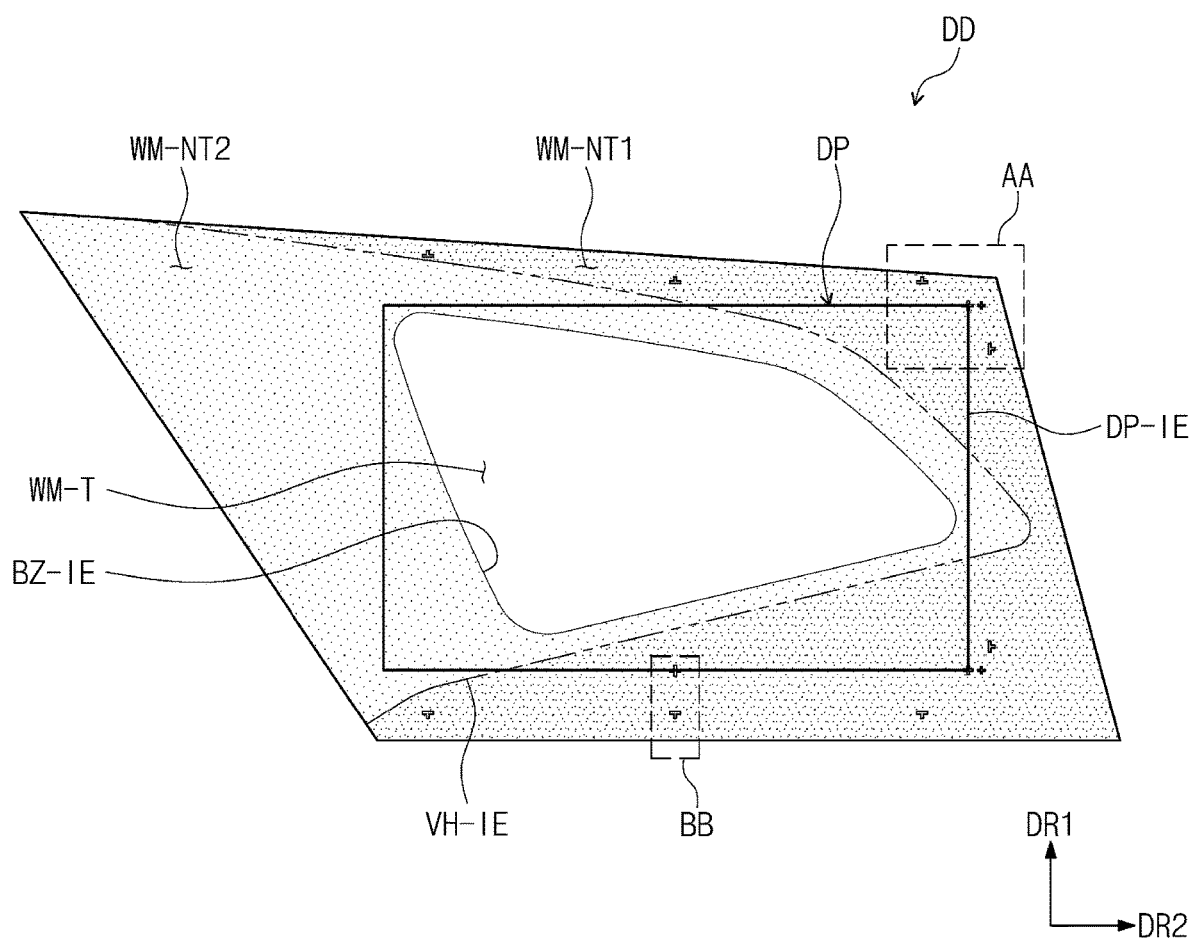
FIG. 6A is a rear view of a display device according to an embodiment of the present disclosure.
Figure 6B:
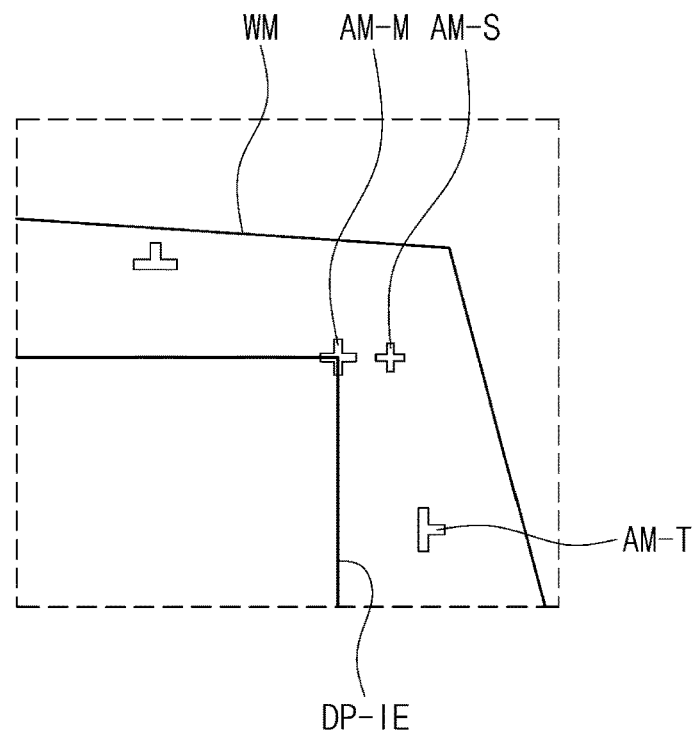
FIGS. 6B and 6C are enlarged views of the portions AA and BB of FIG. 6A, respectively.
Figure 6C:
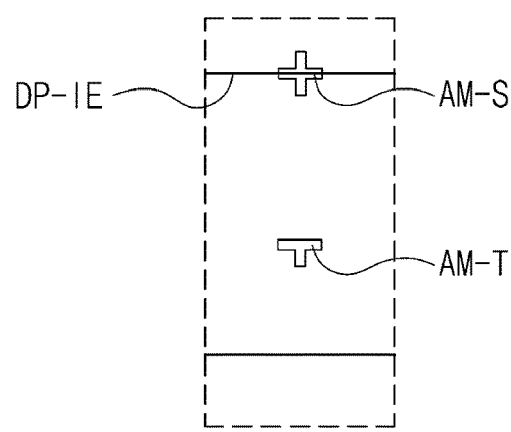

FIG. 6A is a rear view of a display device DD according to an embodiment of the present disclosure. FIGS. 6B and 6C are enlarged views of the portions AA and BB of FIG. 6A, respectively. Hereinafter, detailed descriptions of the same components as mentioned above with reference to FIGS. 1-5C may be omitted for ease and convenience in description.

In the present embodiment, a rectangular display panel DP is illustrated as an example of the display panel DP having the substantially typical polygonal shape. In FIGS. 6A-6C, an edge DP-IE of the display panel DP is illustrated. The edge DP-IE of the display panel DP may be an edge of the encapsulation substrate ES illustrated in, for example, FIG. 5A.

A plurality of alignment marks may be defined on (or in) the bezel layer BZ described above with reference to, for example, FIG. 4C. A colored material may be printed on the base layer BS by, for example, a screen printing process, to form the bezel layer BZ. A mask may be disposed on (or over) an area in which the alignment marks are to be formed, and then, the screen printing process may be performed. Thus, the colored material may not be printed in the area on which the mask is disposed. By this method, light-transmitting (or light-transmissive) alignment marks may be formed concurrently (or simultaneously) with the bezel layer BZ. In this embodiment, the alignment marks may be formed in the bezel layer BZ. The transmission area WM-T may also be an area in which the colored material is not printed.

As illustrated in FIGS. 6A-6C, the plurality of alignment marks may include a main alignment mark AM-M, a sub-alignment mark AM-S, and a test mark AM-T. The main alignment mark AM-M may be used in a lamination process of the display panel DP and the window WM. The sub-alignment mark AM-S may be used to supplement the function of the main alignment mark AM-M in the lamination process of the display panel DP and the window WM.

The test mark AM-T may be disposed outside the display panel DP. The test mark AM-T may be used to calculate a process error of the lamination process after the lamination process. This will be described later in more detail.

According to the present embodiment, the number of main alignment marks AM-M of the display device DD may be less than the number of vertices of the typical polygonal shape defined by the display panel DP. The display device DD, including the rectangular display panel DP, may include, for example, between one and three (e.g., one, two, or three) main alignment marks AM-M. When the display panel DP has a substantially regular polygonal shape having n edges in a plan view, the display device DD may include n−i (n minus i) main alignment mark(s) AM-M, where "i" is a natural number equal to or greater than one and less than n.

FIG. 6A illustrates an embodiment of the display device DD that includes two main alignment marks AM-M. The two main alignment marks AM-M may be disposed at positions corresponding to two vertices corresponding to one side edge DP-IE of the display panel DP.

Because the number of the main alignment marks AM-M is less than the number of the vertices of the typical polygonal shape defined by the display panel DP as described above, the main alignment marks AM-M may not be disposed in the second light blocking area WM-NT2. As a result, the main alignment marks AM-M may be covered by the interior material VH-I (see, e.g., FIG. 3) and, thus, may not be visible to a user.

Each of the main alignment marks AM-M may be disposed at a position corresponding to a vertex of the display panel DP. Thus, the vertices of the display panel DP may overlap with the main alignment marks AM-M. FIG. 6B illustrates a cross-shaped main alignment mark AM-M. FIG. 6B illustrates the display device DD laminated such that the vertex of the display panel DP completely coincides with a center of the cross-shaped main alignment mark AM-M without a process error.

The sub-alignment mark AM-S may be disposed adjacent to the main alignment mark AM-M. In FIG. 6B, a distance between the sub-alignment mark AM-S and the main alignment mark AM-M may be in a range from about 1 mm to about 2 mm. One sub-alignment mark AM-S may be disposed adjacent to each of the main alignment marks AM-M, but embodiments of the present disclosure are not limited thereto.

As illustrated in FIG. 6C, a portion of the sub-alignment mark AM-S may overlap with the edge DP-IE of the display panel DP. The sub-alignment mark AM-S may have the same area as the main alignment mark AM-M or may have a different area than that of the main alignment mark AM-M. The shapes of the sub-alignment mark AM-S and the main alignment mark AM-M are not limited to the shapes described herein.

The sub-alignment mark AM-S adjacent to the main alignment mark AM-M may also be covered by the interior material VH-I (see, e.g., FIG. 3) and, thus, may not be visible to a user. The test mark AM-T may also be formed at a position covered by the interior material VH-I (see, e.g., FIG. 3). A plurality of test marks AM-T may be provided.

Figure 7A:
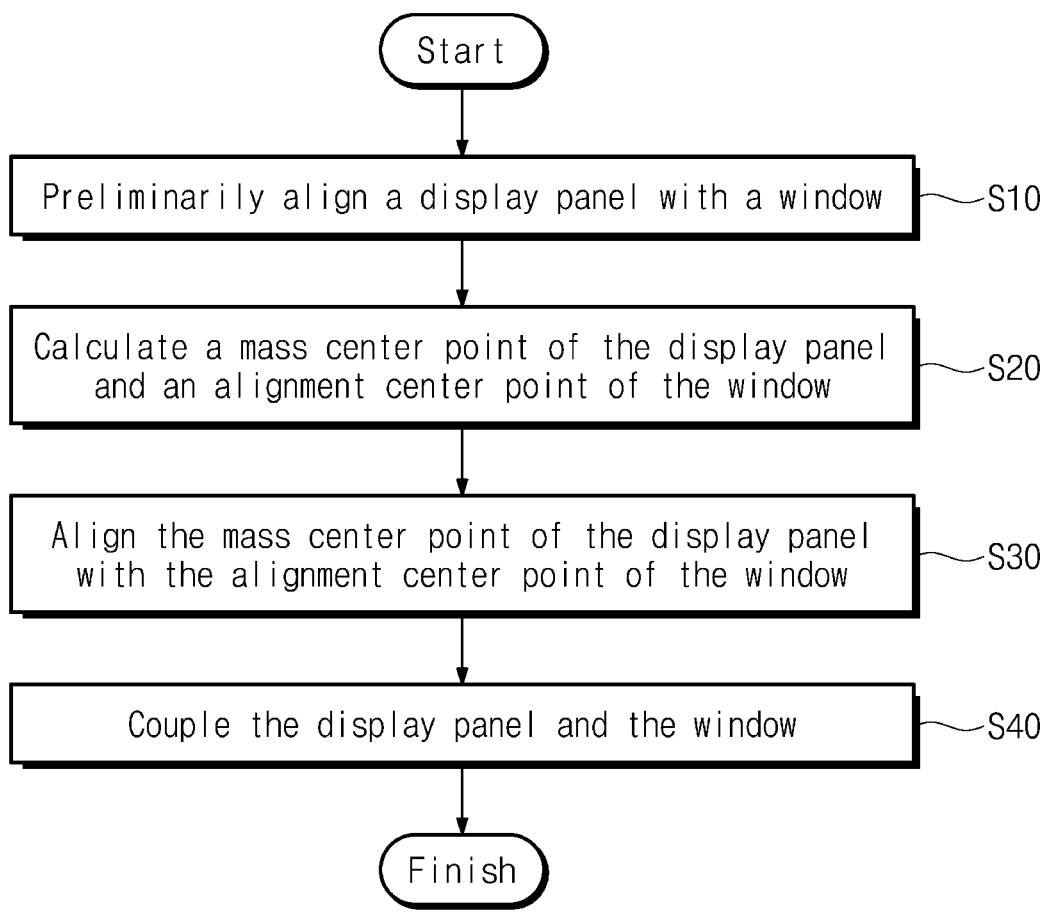
FIG. 7A is a flowchart illustrating a method for fabricating a display device according to an embodiment of the present disclosure.
Figure 7B:
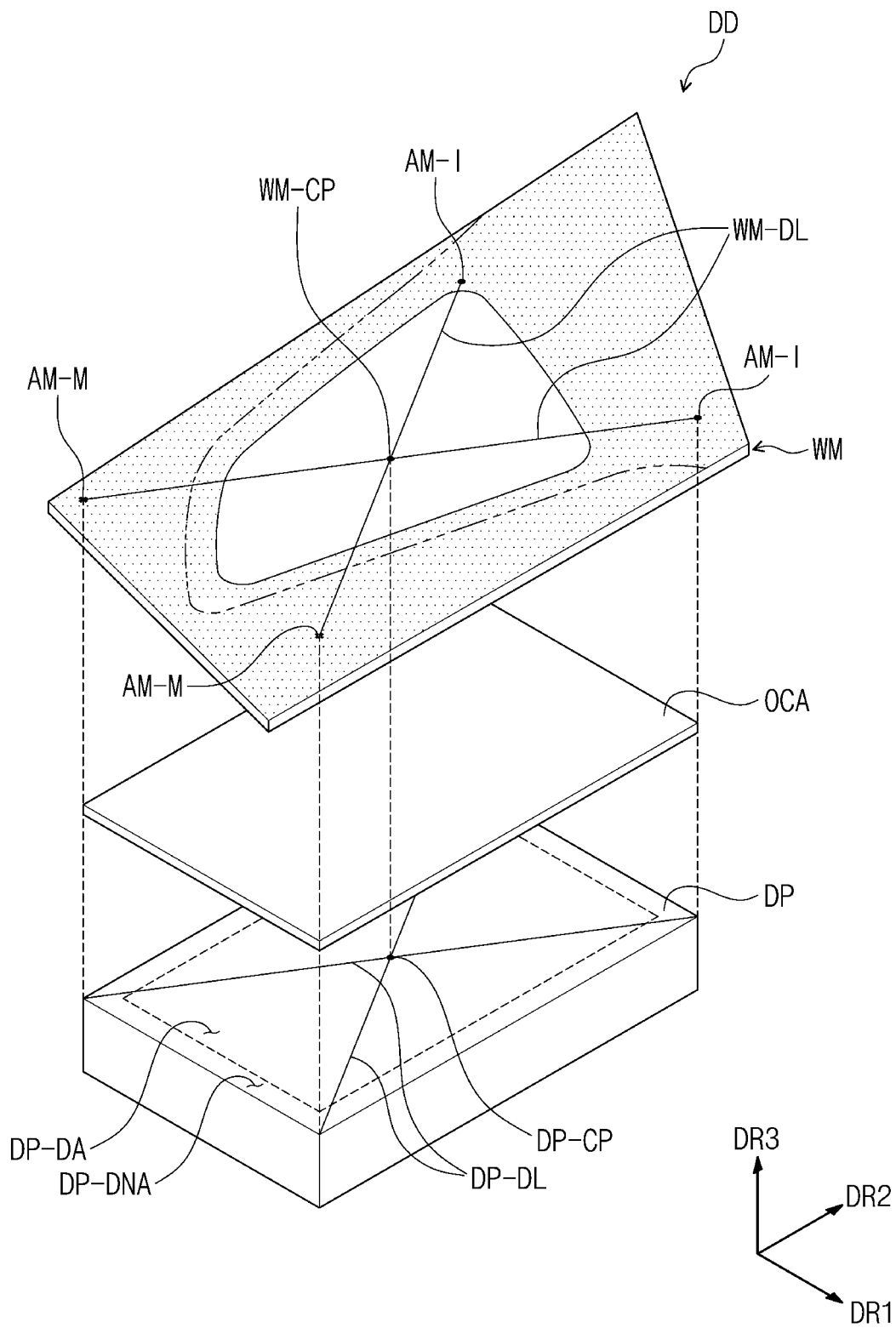
FIG. 7B is a perspective view of an operation of a method for fabricating a display device according to an embodiment of the present disclosure.
Figure 7C:
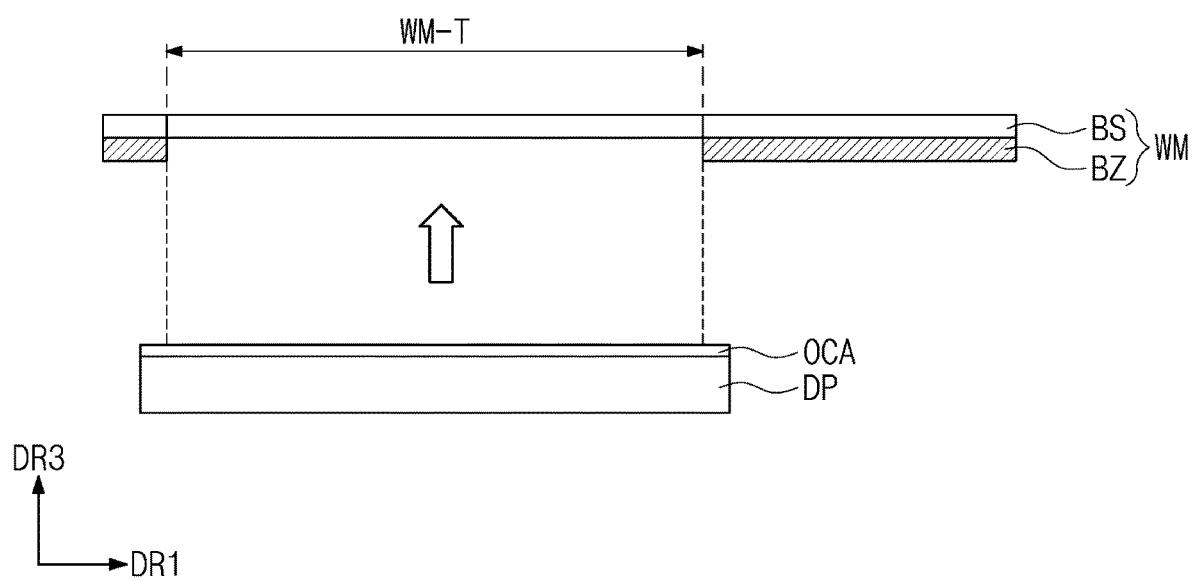
FIG. 7C is a side view of an operation of a method for fabricating a display device according to an embodiment of the present disclosure.

FIG. 7A is a flowchart illustrating a method for fabricating the display device DD according to an embodiment of the present disclosure. FIG. 7B is a perspective view of an operation of the method for fabricating the display device DD according to an embodiment of the present disclosure. FIG. 7C is a side view of an operation of the method for fabricating the display device DD according to an embodiment of the present disclosure. Hereinafter, detailed descriptions of the same components as mentioned above with reference to FIGS. 1-6C may be omitted for ease and convenience in description.

As illustrated in FIGS. 7A and 7B, the display panel DP may be preliminarily aligned with the window WM (S10). The display panel DP and the window WM may be aligned such that a top surface of the display panel DP faces a bottom surface of the window WM. The display panel DP may be placed on a stage of a lamination apparatus, and the window WM may be held by a holder of the lamination apparatus. The holder may be disposed over the stage.

At this time, the adhesive member OCA may be disposed between the display panel DP and the window WM. The adhesive member OCA may be adhered to one of the top surface of the display panel DP and the bottom surface of the window WM.

Next, as illustrated in FIGS. 7A and 7B, a center point (e.g., a mass center point) DP-CP of the display panel DP and an alignment center point WM-CP of the window WM may be calculated (S20). The display panel DP may be photographed by using a camera module. A computer system of the lamination apparatus may calculate coordinate information (e.g., position information) of vertices of the display panel DP by using an image of the display panel DP. The computer system may calculate the center point DP-CP by using the coordinate information of the vertices. Two imaginary diagonal lines DP-DL linking (e.g., extending between) the vertices (e.g., linking or extending between opposite vertices) may be set (or calculated), and then, an intersecting point of the two imaginary diagonal lines DP-DL may be calculated as the center point DP-CP. The center point DP-CP may be calculated by a method of calculating a mathematical mass center point.

A method of setting a center point of a regular polygon having an odd number of edges (e.g., a center point of a regular pentagon) will be described briefly. Five imaginary lines, which link (e.g., extend between) the vertices to a center point of an edge facing each of the vertices, may be set (or calculated). The five imaginary lines may intersect each other at one point, and the one point may be set as a center point. Thus, the center point may be calculated by using coordinate information of the vertices.

The window WM may be photographed by using the camera module. Information on a smaller number of the main alignment marks AM-M than the number of the vertices of the display panel DP may be obtained. The computer system may calculate coordinate information of the main alignment marks AM-M by using an image of the window WM (e.g., an image of the main alignment marks AM-M).

Coordinate information of imaginary points AM-I corresponding to vertices of the display panel DP, which do not correspond to the main alignment marks AM-M, may be calculated by using the coordinate information of the main alignment marks AM-M and previously inputted (e.g., stored in a memory) numerical information of the display panel DP (e.g., the dimensions of the display panel DP). The computer system may calculate the alignment center point WM-CP by using the coordinate information of the main alignment marks AM-M and the coordinate information of the imaginary points AM-I. Two imaginary diagonal lines WM-DL linking (e.g., extending between) the main alignment marks AM-M and the imaginary points AM-I may be set (or calculated), and then, an intersecting point of the two imaginary diagonal lines WM-DL may be calculated as the alignment center point WM-CP.

Subsequently, as illustrated in FIGS. 7A and 7B, the center point DP-CP may be aligned with the alignment center point WM-CP (S30). Positions of the stage and the holder may be adjusted to align the center point DP-CP with the alignment center point WM-CP.

At this time, the positions of the stage and the holder may be adjusted such that the main alignment marks AM-M are aligned with some corresponding vertices of the display panel DP. The position of the display panel DP or the window WM may be adjusted such that other vertices of the display panel DP are aligned with the imaginary points AM-I.

At this time, an alignment state of the display panel DP and the window WM may be inspected or checked by using the sub-alignment mark AM-S illustrated in FIG. 6C. When the sub-alignment mark AM-S coincides with the edge of the display panel DP, a subsequent process may be performed. When the sub-alignment mark AM-S does not coincide with the edge of the display panel DP, a process to be described later with reference to FIGS. 10A and 10B may be additionally performed.

Next, as illustrated in FIGS. 7A and 7C, the window WM and the display panel DP may be coupled to each other (S40). The stage may move in the third direction DR3, and thus, the display panel DP may approach the window WM. The window WM and the display panel DP may be coupled to each other in a state in which the adhesive member OCA is disposed on the top surface of the display panel DP. The adhesive member OCA may be a sheet or a resin. However, the method of coupling the window WM and the display panel DP to each other is not limited thereto.

After coupling the window WM and the display panel DP to each other, a process of inspecting or checking a process error may be performed. When the process error is equal to or greater than a reference value, a corresponding display device DD may be determined to be (e.g., may be classified as) a defective product. A distance between the edge DP-IE of the display panel DP and the test mark AM-T described with reference to FIGS. 6A-6C may be calculated, and the calculated distance may be compared with a reference value. A rear surface of the display device DD may be photographed by using the camera module, and the computer system may calculate the distance based on the photographed image.

Each of the test marks AM-T may have preset coordinate information. The test marks AM-T may be spaced from the edge DP-IE of the display panel DP by different distances. A plurality of distances may be calculated to improve reliability of inspection.

Figure 8A:
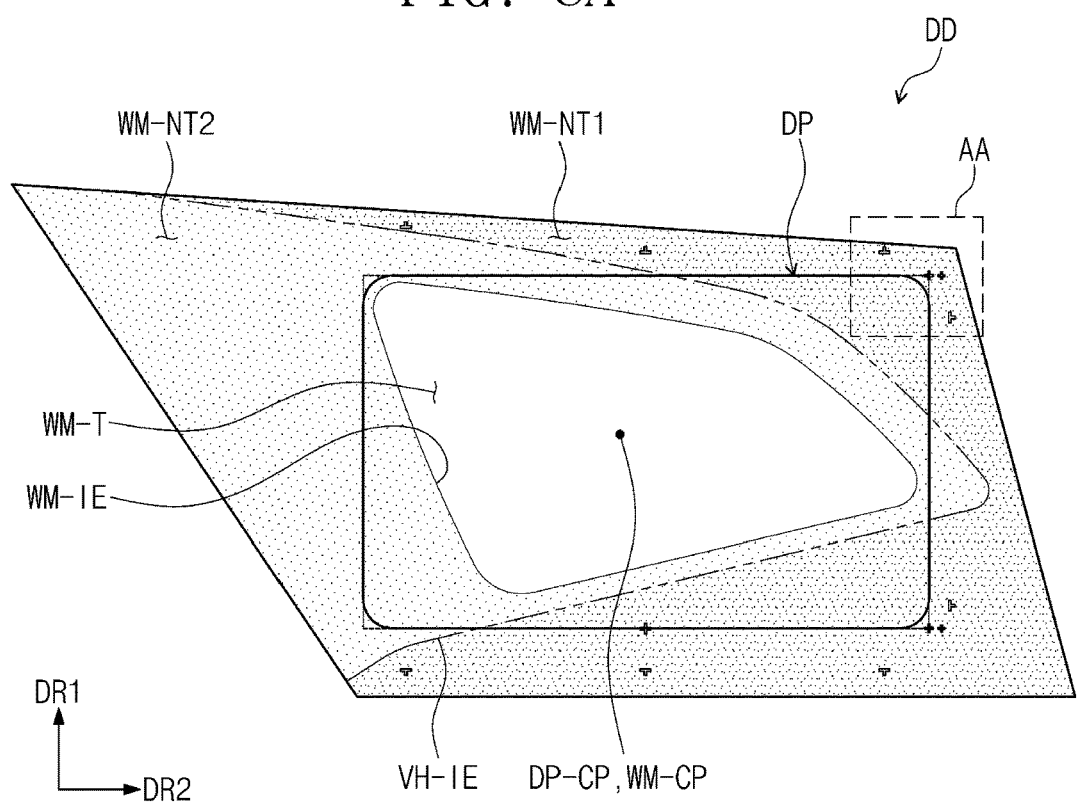
FIG. 8A is a rear view of a display device according to an embodiment of the present disclosure.
Figure 8B:
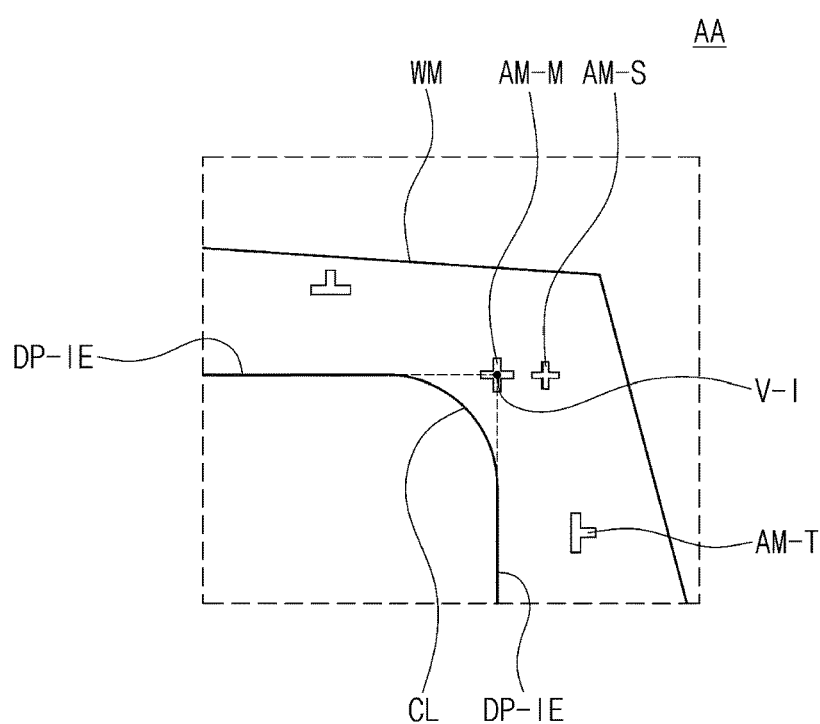
FIG. 8B is an enlarged view of the portion AA of FIG. 8A.

FIG. 8A is a rear view of a display device DD according to an embodiment of the present disclosure. FIG. 8B is an enlarged view of the portion AA of FIG. 8A. Hereinafter, detailed descriptions of the same components as mentioned above with reference to FIGS. 1-7C may be omitted for ease and convenience in description.

FIG. 8A illustrates a display panel DP which has a roughly (e.g., generally or substantially) rectangular shape in a plan view. A curved line CL may be defined in a curved corner area of the display panel DP (e.g., the corner of the display panel DP may have be curved or rounded). The curved line CL may be defined by an edge of a display substrate DS or an edge of an encapsulation substrate ES. For example, the edge of the display substrate DS or the edge of the encapsulation substrate ES may have the curved line CL in its corner area.

The computer system of the lamination apparatus may calculate coordinate information (e.g., position information) of imaginary vertices V-I by using an image of corner areas, which is obtained by the camera module. The imaginary vertex V-I may be a point at which two edges DP-IE would intersect each other if the edges remained straight (e.g., if the edges DP-IE did not have the curved or rounded corners).

A center point DP-CP of the display panel DP may be calculated by using the coordinate information of the imaginary vertices V-I. Two imaginary diagonal lines linking (e.g., extending between) the imaginary vertices V-I may be set (or calculated), and then, an intersecting point of the two imaginary diagonal lines may be calculated as the center point DP-CP. The main alignment mark AM-M may be disposed at a position corresponding to the imaginary vertex V-I.

Figure 9A:
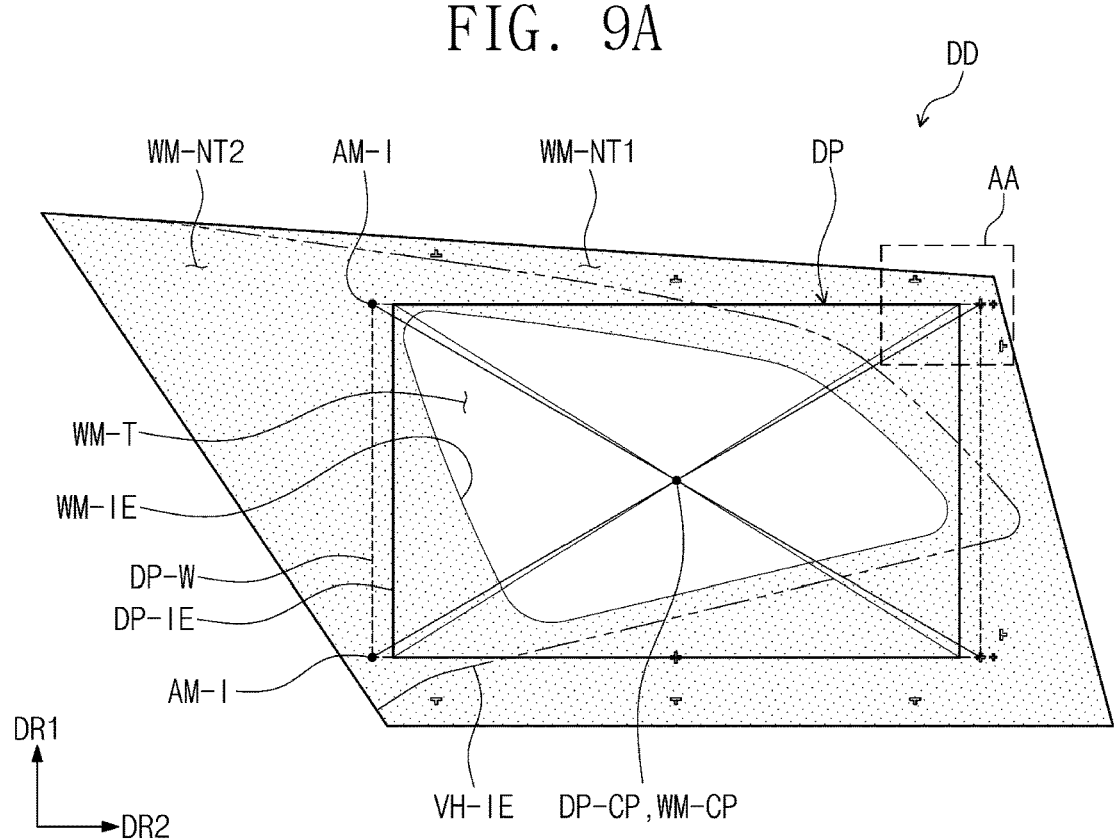
FIG. 9A is a rear view of a display device according to an embodiment of the present disclosure.
Figure 9B:
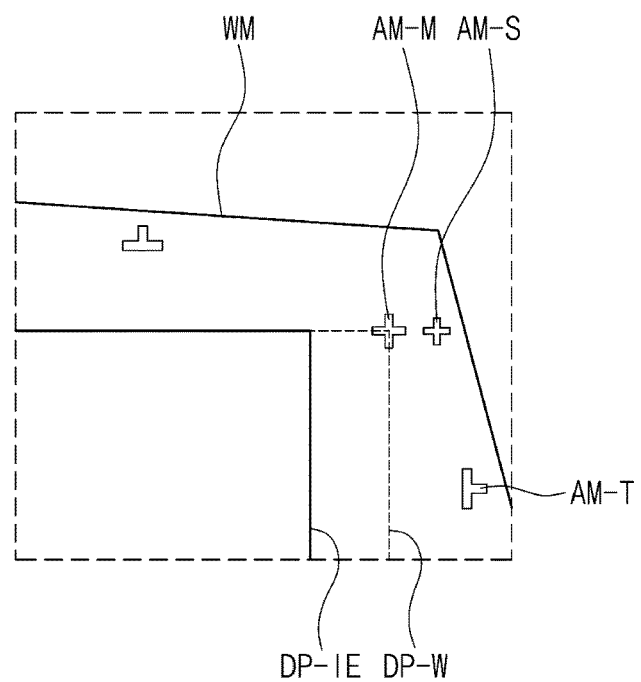
FIG. 9B is an enlarged view of the portion AA of FIG. 9A.
Figure 9C:
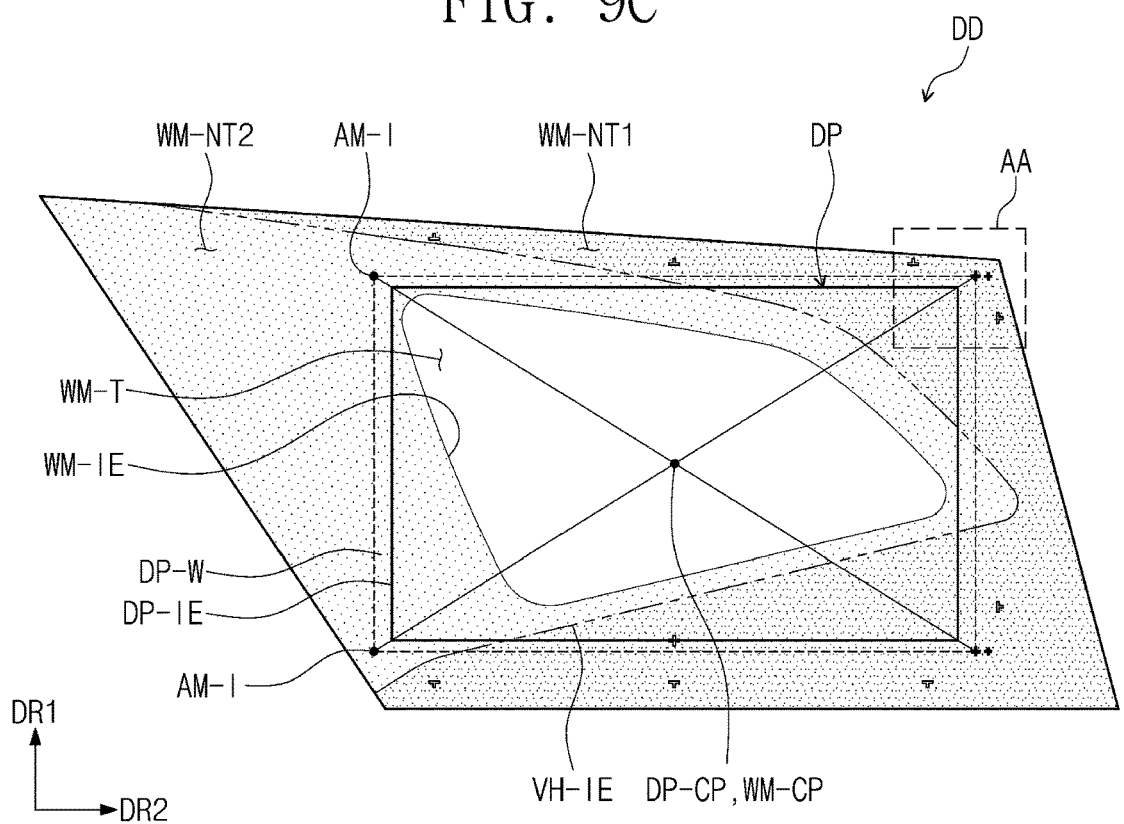
FIG. 9C is a rear view of a display device according to an embodiment of the present disclosure.
Figure 9D:
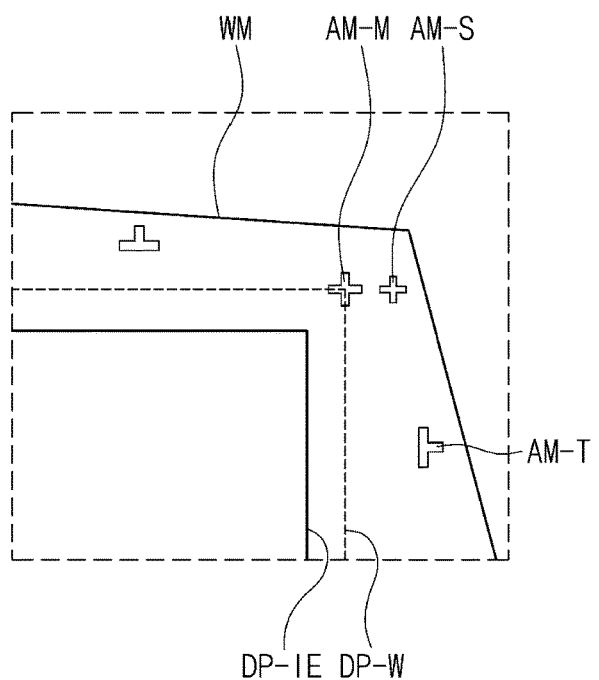
FIG. 9D is an enlarged view of the portion AA of FIG. 9C.

FIG. 9A is a rear view of a display device DD according to an embodiment of the present disclosure. FIG. 9B is an enlarged view of the portion AA of FIG. 9A. FIG. 9C is a rear view of a display device DD according to an embodiment of the present disclosure. FIG. 9D is an enlarged view of the portion AA of FIG. 9C. Hereinafter, detailed descriptions of the same components as mentioned above with reference to FIGS. 1-8B may be omitted for ease and convenience in description.

The main alignment mark AM-M may be disposed at a position corresponding to a vertex of a rectangle or a regular polygon having n edges, which has the same center point DP-CP as the display panel DP and which is greater than (e.g., which is larger than) the display panel DP. The rectangle or the regular polygon may be an imaginary rectangle or an imaginary regular polygon. A rectangle DP-W that is greater than (e.g., that is larger than and/or surrounds or extends around a periphery of) the display panel DP is illustrated as an example in FIGS. 9A-9D.

As illustrated in FIGS. 9A and 9B, the rectangle DP-W may have a length in the second direction DR2 that is greater than that of the display panel DP. In another embodiment, the rectangle DP-W may have a length in the first direction DR1 that is greater than that of the display panel DP. In still another embodiment, as illustrated in FIGS. 9C and 9D, the rectangle DP-W may have a length in the first direction DR1 and a length in the second direction DR2 that are greater than those of the display panel DP.

Coordinate information of the imaginary points AM-I may be calculated by using coordinate information of the main alignment marks AM-M, the previously inputted (or stored in the memory) numerical information of the display panel DP, and distance information between the vertices of the display panel DP and the main alignment marks AM-M.

An alignment center point WM-CP may be calculated by using the coordinate information of the imaginary points AM-I and the coordinate information of the main alignment marks AM-M. Two imaginary diagonal lines linking (e.g., extending between) the imaginary points AM-I and the main alignment marks AM-M may be set (or calculated), and then, an intersecting point of the two imaginary diagonal lines may be calculated as the alignment center point WM-CP.

Figure 10A:
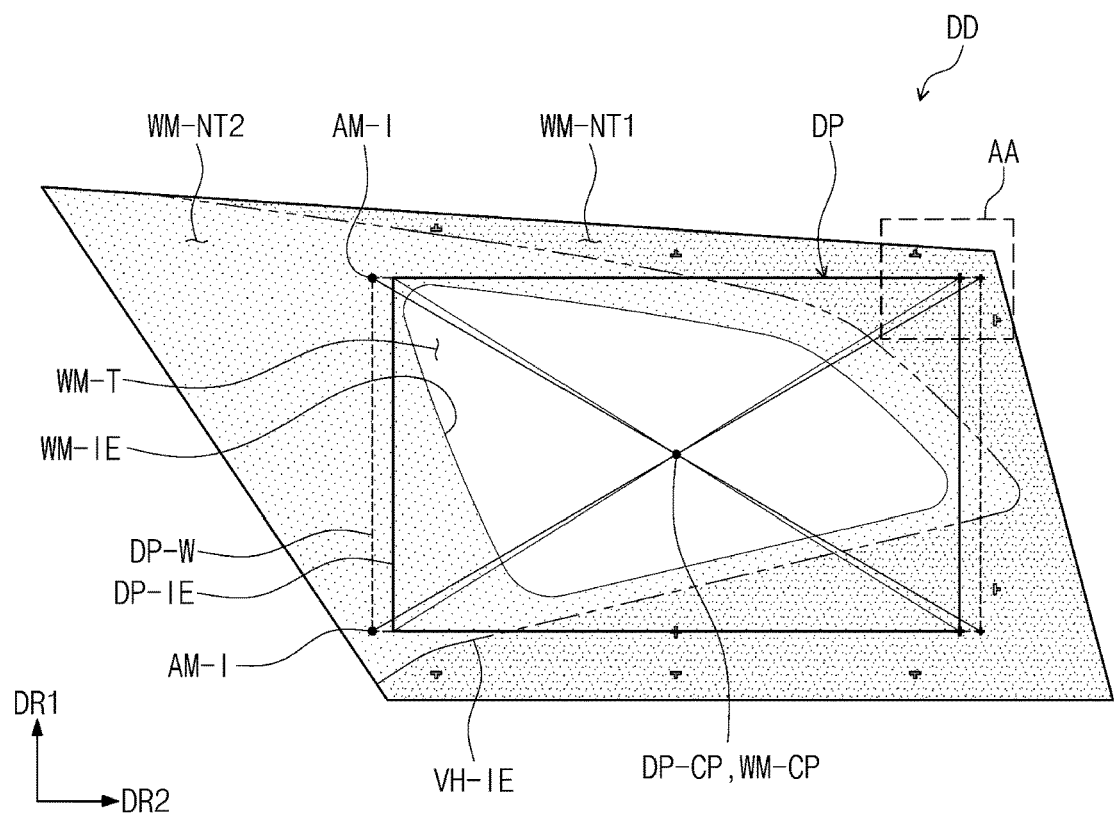
FIG. 10A is a rear view of a display device according to an embodiment of the present disclosure.
Figure 10B:
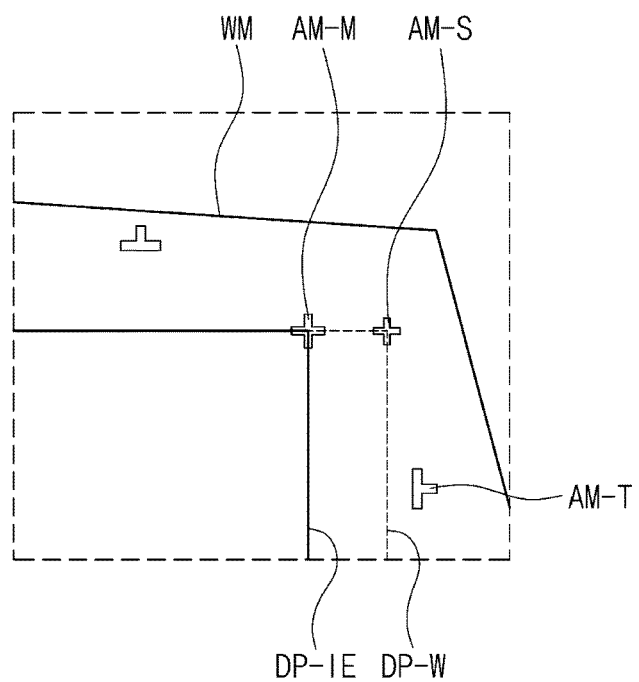
FIG. 10B is an enlarged view of the portion AA of FIG. 10A.

FIG. 10A is a rear view of a display device DD according to an embodiment of the present disclosure. FIG. 10B is an enlarged view of the portion AA of FIG. 10A. Hereinafter, detailed descriptions of the same components as mentioned above with reference to FIGS. 1-9D may be omitted for ease and convenience in description.

The main alignment mark AM-M may be disposed at a position corresponding to a vertex of the display panel DP having the rectangular shape or the regular polygonal shape having n edges. The sub-alignment mark AM-S may be disposed at a position corresponding to a vertex of a rectangle or a regular polygon having n edges that has the same center point DP-CP as the display panel DP and that is greater than (e.g., larger than) the display panel DP. The rectangle or the regular polygon may be an imaginary rectangle or an imaginary regular polygon. A rectangle DP-W greater than (e.g., larger than) the display panel DP is illustrated as an example in FIGS. 10A and 10B.

In the aligning operation described above with reference to FIGS. 7A and 7B, when an error (or a difference) occurs between the alignment center point WM-CP and the center point DP-CP, which are calculated based on the main alignment mark AM-M, the imaginary points AM-I and the alignment center point WM-CP may be re-calculated by using the sub-alignment mark AM-S. The error between the center point DP-CP and the alignment center point WM-CP may be caused by a process error occurring when the bezel layer BZ is printed on the base layer BS. For example, the error may exist because the main alignment mark AM-M is formed at a position different from a designed position.

The imaginary points AM-I and the alignment center point WM-CP may be re-calculated by using the sub-alignment mark AM-S by the method described above with reference to FIGS. 9A and 9B. Coordinate information of the imaginary points AM-I may be calculated by using coordinate information of the sub-alignment mark AM-S, the previously inputted numerical information of the display panel DP, and distance information between the vertex of the display panel DP and the sub-alignment mark AM-S. As illustrated in FIG. 10A, the imaginary points AM-I may be set in the second light blocking area WM-NT2 in which the sub-alignment mark AM-S is not formed.

Figure 11A:
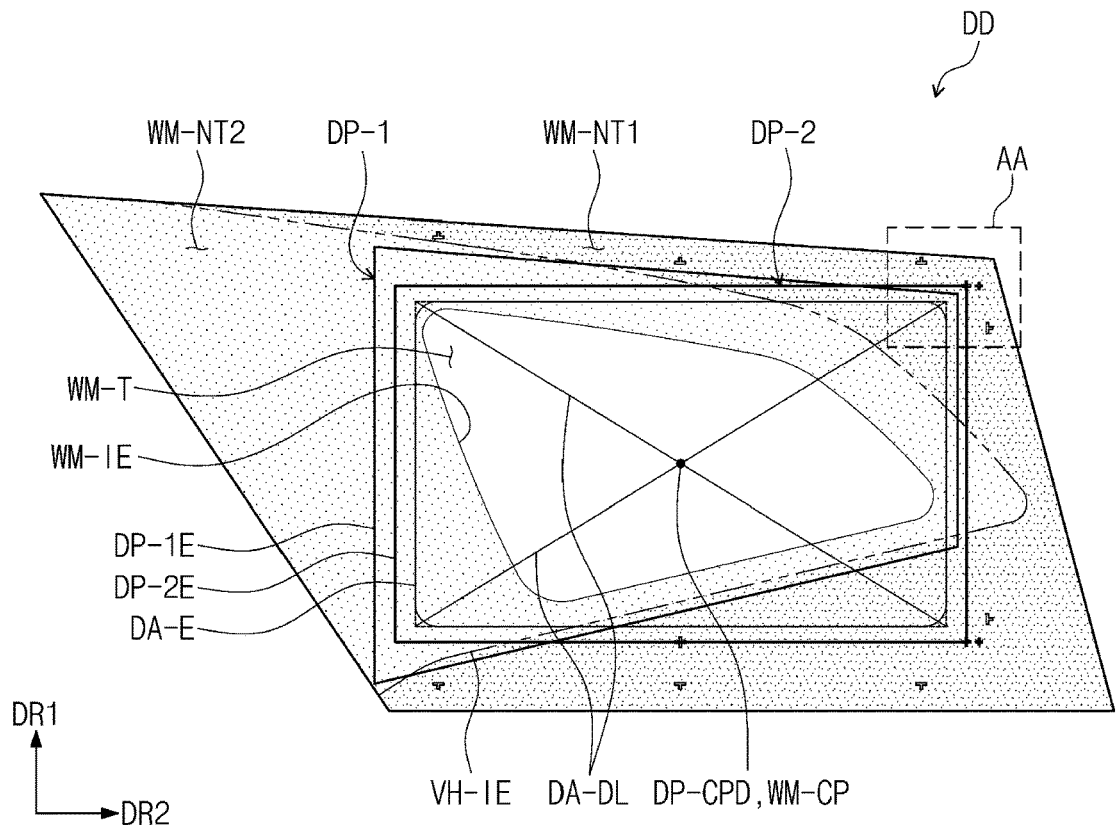
FIG. 11A is a rear view of a display device according to an embodiment of the present disclosure.
Figure 11B:
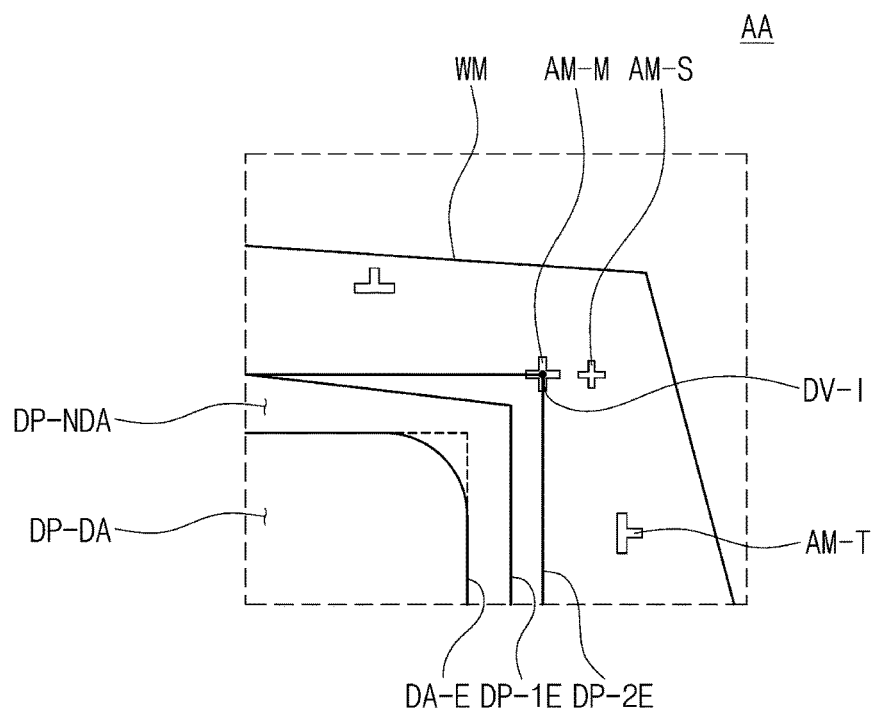
FIG. 11B is an enlarged view of the portion AA of FIG. 11A.

FIG. 11A is a rear view of a display device DD according to an embodiment of the present disclosure. FIG. 11B is an enlarged view of the portion AA of FIG. 11A. Hereinafter, detailed descriptions of the same components as mentioned above with reference to FIGS. 1-10B may be omitted for ease and convenience in description.

A display area DP-DA according to the present embodiment may have a substantially rectangular shape or a substantially regular polygonal shape when viewed in a plan view. A display panel DP-1 or DP-2 may be photographed, and a photographed image of the display panel DP-1 or DP-2 may be processed to set (or calculate) an imaginary boundary line DA-E of the display area DP-DA. The imaginary boundary line DA-E may determine the shape of the display area DP-DA. In the present embodiment, the display area DP-DA having a roughly rectangular shape is illustrated as an example. For example, the display area DP-DA may have a curved corner area.

The computer system of the lamination apparatus may calculate coordinate information (e.g., position information) of imaginary vertices DV-I of the display area DP-DA by using the imaginary boundary line DA-E. A mass center point DP-CPD of the display area DP-DA may be calculated by using the coordinate information of the imaginary vertices DV-I. Two imaginary diagonal lines DA-DL linking (e.g., extending between) the imaginary vertices DV-I may be set (or calculated), and then, an intersecting point of the two imaginary diagonal lines DA-DL may be calculated as the mass center point DP-CPD of the display area DP-DA.

The main alignment mark AM-M may be disposed at a position corresponding to a vertex of a rectangle or a regular polygon which has the same mass center point as the display area DP-DA and is greater than (e.g., larger than) the display area DP-DA. The main alignment mark AM-M may be disposed outside the display panel DP-1 or DP-2 when viewed in a plan view.

The present embodiment may be applied to a display panel DP-1 that does not have a substantially rectangular shape or a substantially regular polygonal shape but has an atypical shape. The display panel DP-1 and the window WM may be accurately laminated according to the display area DP-DA.

In an embodiment of the present disclosure, when the display panel DP-2 has the substantially rectangular shape or the substantially regular polygonal shape, the mass center point DP-CPD of the display panel DP-2 may be calculated by using the display area DP-DA. In the aligning operation described above with reference to FIGS. 7A and 7B, when an error (or a difference) occurs between the center point DP-CP calculated by using the vertices of the display panel DP and the alignment center point WM-CP calculated based on the main alignment mark AM-M, the mass center point DP-CPD may be re-calculated by using the display area DP-DA.

FIG. 11A illustrates the display panel DP-1 having the atypical shape and the display panel DP-2 having the rectangular shape. It is assumed that the two display panels DP-1 and DP-2 have the same display area DP-DA.

According to the above embodiments of the present disclosure, a positioning error or failure may be avoided in the process of coupling the window having an atypically-shaped transmission area and the typically-shaped display panel. This may be because the positions of the imaginary points and the position of the alignment center point may be calculated by using the main alignment mark formed in the window, and the display panel and the window may be laminated by using the calculated values.

Because the number of the main alignment mark(s) is less than the number of the vertices of the display panel, the main alignment mark may not be formed in a portion (or area) of the window that is exposed to (e.g., is visible to) a user.

While the inventive concepts have been described with reference to example embodiments, it will be apparent to those skilled in the art that various changes and modifications may be made to the example embodiments without departing from the spirit and scope of the inventive concepts. Therefore, it should be understood that the above embodiments are not limiting but are illustrative. Thus, the scope of the inventive concepts are to be determined by the broadest permissible interpretation of the following claims and their equivalents and shall not be restricted or limited by the foregoing description.

What is claimed is:

1. A display device comprising:
   a window; and
   a display panel coupled to a bottom surface of the window and having a substantially regular tetragonal shape or a substantially rectangular shape in a plan view,
   wherein the window comprises:
      a base member; and
      a bezel layer on a bottom surface of the base member, between one and three light-transmissive main alignment marks and a transmission area having a different shape than that of the display panel being defined in the bezel layer,
   wherein each of the main alignment marks is arranged at a position corresponding to a vertex of the display panel or at a position corresponding to a vertex of an imaginary regular tetragon or of an imaginary rectangle that has the same center point as the display panel and that is larger than the display panel.

2. The display device of claim 1, wherein when two main alignment marks are defined in the bezel layer, the two main alignment marks are arranged at positions corresponding to two vertices corresponding to one side edge of the display panel.

3. The display device of claim 1, wherein each of the main alignment marks overlaps the vertex of the display panel.

4. The display device of claim 1, wherein the display panel has a display area in which a pixel is arranged and a non-display area in which no pixel is arranged, and
   wherein the non-display area surrounds a periphery of the display area in a plan view.

5. The display device of claim 1, further comprising a light-transmissive sub-alignment mark defined in the bezel layer, spaced from the main alignment marks, and having a different shape than that of the main alignment marks.

6. The display device of claim 5, wherein the sub-alignment mark overlaps an edge of the display panel.

7. The display device of claim 1, further comprising a light-transmissive test mark defined in the bezel layer and arranged outside of the display panel.

8. The display device of claim 1, wherein a corner area of the display panel has a curved line shape in a plan view.

9. The display device of claim 1, wherein the display device is installed in a vehicle.

10. The display device of claim 9, wherein the transmission area is exposed from an interior material of the vehicle,
    wherein the interior material of the vehicle covers a portion of the bezel layer, and
    wherein the main alignment marks overlap the interior material of the vehicle.

11. A display device comprising:
    a window; and
    a display panel coupled to a bottom surface of the window and having:
       a display area having a substantially regular tetragonal shape or a substantially rectangular shape in a plan view; and
       a non-display area outside of the display area,
    wherein the window comprises:
       a base member; and
       a bezel layer on a bottom surface of the base member, between one and three light-transmissive main alignment marks and a transmission area having a different shape than that of the display area being defined in the bezel layer, and
    wherein each of the main alignment marks is arranged at a position corresponding to a vertex of an imaginary regular tetragon or an imaginary rectangle that has the same center point as the display area and is larger than the display area.

12. The display device of claim 11, wherein the display panel has a different shape than that of the display area in a plan view.

13. The display device of claim 11, wherein the display panel has a substantially regular tetragonal shape or a substantially rectangular shape in a plan view.

14. The display device of claim 13, wherein each of the main alignment marks is arranged at a position corresponding to a vertex of the display panel.

15. A display device comprising:
    a window; and
    a display panel coupled to a bottom surface of the window and having a regular tetragonal shape with a curved corner area in a plan view or a rectangular shape with a curved corner area in a plan view,
    wherein the window comprises:
       a base member; and
       a bezel layer on a bottom surface of the base member, between one and three light-transmissive main alignment marks and a transmission area having a different shape than that of the display panel being defined in the bezel layer, wherein each of the main alignment marks is arranged at a position corresponding to a vertex of the display panel or at a position corresponding to a vertex of an imaginary regular tetragon or an imaginary rectangle that has the same center point as the display panel and that is larger than the display panel.

16. A display device comprising:
a window; and
a display panel coupled to a bottom surface of the window and having a substantially regular polygonal shape having n edges in a plan view,
wherein the window comprises:
   a base member; and
   a bezel layer on a bottom surface of the base member, a number of light-transmissive alignment marks and a transmission area having a different shape than that of the display panel being defined in the bezel layer,
wherein the number of the alignment marks is n-i, where "i" is a natural number equal to or greater than one and less than "n", and
wherein each of the alignment marks is arranged at a position corresponding to a vertex of the display panel or at a position corresponding to a vertex of an imaginary polygon that has the same center point as the display panel and that is larger than the display panel.

17. A method for fabricating a display device, the method comprising:
preliminarily aligning a display panel with a window, the display panel having a substantially regular tetragonal shape or a substantially rectangular shape, the window having a transmission area having a different shape than that of the display panel, a non-transmission area adjacent to the transmission area, and a number of main alignment marks in the non-transmission area;
calculating positions of vertices of the display panel and a position of a center point of the display panel;
calculating positions of imaginary points on the window corresponding to at least some of the vertexes of the display panel and a position of an alignment center point of the window corresponding to the center point of the display panel by using numerical information of the display panel and the main alignment marks;
aligning the center point of the display panel with the alignment center point of the window such that the center point coincides with the alignment center point; and
coupling the window and the display panel to each other,
wherein the number of the main alignment marks is less than the number of the vertices of the display panel.

18. The method of claim 17, wherein the window further comprises a sub-alignment mark spaced from the main alignment mark and arranged at a position corresponding to a vertex of an imaginary regular tetragon or an imaginary rectangle that has the same center point as the display panel and that is larger than the display panel, the method further comprising:
re-calculating the imaginary points and the alignment center point by using the sub-alignment mark when an error occurs between the center point and the alignment center point during the aligning of the center point with the alignment center point.

19. The method of claim 17, wherein the window further comprises a test mark spaced from the main alignment mark, the method further comprising:
calculating a distance between the test mark and an edge of the display panel after the coupling of the window and the display panel.

20. The method of claim 17, further comprising placing an adhesive member between the display panel and the window.

21. The method of claim 17, wherein the main alignment mark comprises two main alignment marks, and
wherein the two main alignment marks are arranged at positions corresponding to two vertices corresponding to one side edge of the display panel.

* * * * *